(12) United States Patent
Inamasu

(10) Patent No.: US 10,373,847 B2
(45) Date of Patent: Aug. 6, 2019

(54) BONDING APPARATUS

(71) Applicant: Tokyo Electron Limited, Tokyo (JP)

(72) Inventor: Toshifumi Inamasu, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/644,928

(22) Filed: Jul. 10, 2017

(65) Prior Publication Data

US 2018/0019140 A1     Jan. 18, 2018

(30) Foreign Application Priority Data

Jul. 12, 2016 (JP) ................................. 2016-137636

(51) Int. Cl.
*H01L 21/67* (2006.01)
*H01L 21/68* (2006.01)
*H01L 21/683* (2006.01)

(52) U.S. Cl.
CPC .... *H01L 21/67092* (2013.01); *H01L 21/6838* (2013.01)

(58) Field of Classification Search
CPC ........... H01L 21/67095; H01L 21/6838; H01L 21/68728; H01L 21/68785; H01L 21/68792; H01L 21/67092; H01L 21/68771
See application file for complete search history.

(56) References Cited

U.S. PATENT DOCUMENTS

| 5,564,682 | A | * | 10/1996 | Tsuji | ..................... | B25B 11/005 |
| | | | | | | 269/21 |
| 2012/0251789 | A1 | * | 10/2012 | Tanaka | ............. | H01L 21/67092 |
| | | | | | | 428/170 |
| 2013/0327463 | A1 | * | 12/2013 | Kitahara | ........... | H01L 21/67092 |
| | | | | | | 156/64 |

FOREIGN PATENT DOCUMENTS

JP      2015-018919 A      1/2015

\* cited by examiner

*Primary Examiner* — George R Koch
(74) *Attorney, Agent, or Firm* — Pearne & Gordon LLP

(57) ABSTRACT

A bonding apparatus includes an upper holding unit, a lower holding unit, a pushing unit and an attracting/holding unit. The upper holding unit is configured to hold a first substrate from a top surface thereof which is a non-bonding surface. The lower holding unit is provided under the upper holding unit and is configured to hold a second substrate from a bottom surface thereof while allowing the second substrate to face the first substrate. The pushing unit is configured to press a central portion of the first substrate from above to bring the central portion of the first substrate into contact with the second substrate. The attracting/holding unit is configured to be moved up and down with respect to the upper holding unit and hold a part of the top surface of the first substrate by attraction before the first substrate is held by the upper holding unit.

7 Claims, 20 Drawing Sheets

US 10,373,847 B2

BONDING APPARATUS

CROSS-REFERENCE TO RELATED APPLICATION

This application claims the benefit of Japanese Patent Application No 2016-137636 filed on Jul. 12, 2016, the entire disclosures of which are incorporated herein by reference.

TECHNICAL FIELD

The embodiments described herein pertain generally to a bonding apparatus.

BACKGROUND

Conventionally, to meet a requirement for high integration of semiconductor devices, there has been proposed using a three-dimensional integration technology of stacking semiconductor devices three-dimensionally. As a system using this three-dimensional integration technology, there is known a bonding system of bonding substrates such as semiconductor wafers (hereinafter, simply referred to as "wafers") (see, for example, Patent Document 1).

In this bonding system, after surfaces of a first substrate and a second substrate to be coupled to each other are modified and hydrophilized, the first substrate and the second substrate are bonded to each other by a Van der Waals force and a hydrogen bond (intermolecular force) in a bonding apparatus.

In the aforementioned bonding apparatus, however, an upper holding unit, for example, holds the first substrate by attracting an entire surface of the first substrate at a side of an upper surface which is a non-bonding surface. For this reason, a transfer device configured to transfer the first substrate with respect to the bonding apparatus transfers the first substrate to the upper holding unit while holding a periphery portion of a lower surface side of the first substrate which is a bonding surface.

Patent Document 1: Japanese Patent Laid-open Publication No. 2015-018919

In the aforementioned bonding apparatus, however, since the first substrate is transferred while the bonding surface thereof is held by the transfer device, there is a concern that particles may adhere to the first substrate. In this consideration, the bonding apparatus still has room for improvement in the aspect of suppressing particles.

SUMMARY

In view of the foregoing, exemplary embodiments provide a bonding apparatus capable of suppressing generation of particles.

In one exemplary embodiment, a bonding apparatus includes an upper holding unit, a lower holding unit, a pushing unit and an attracting/holding unit. The upper holding unit is configured to hold a first substrate from a top surface thereof which is a non-bonding surface. The lower holding unit is provided under the upper holding unit and is configured to hold a second substrate from a bottom surface thereof while allowing the second substrate to face the first substrate. The pushing unit is configured to press a central portion of the first substrate from above to bring the central portion of the first substrate into contact with the second substrate. The attracting/holding unit is configured to be moved up and down with respect to the upper holding unit and hold a part of the top surface of the first substrate by attraction before the first substrate is held by the upper holding unit.

According to the exemplary embodiment, the particle generation can be suppressed in the bonding apparatus.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
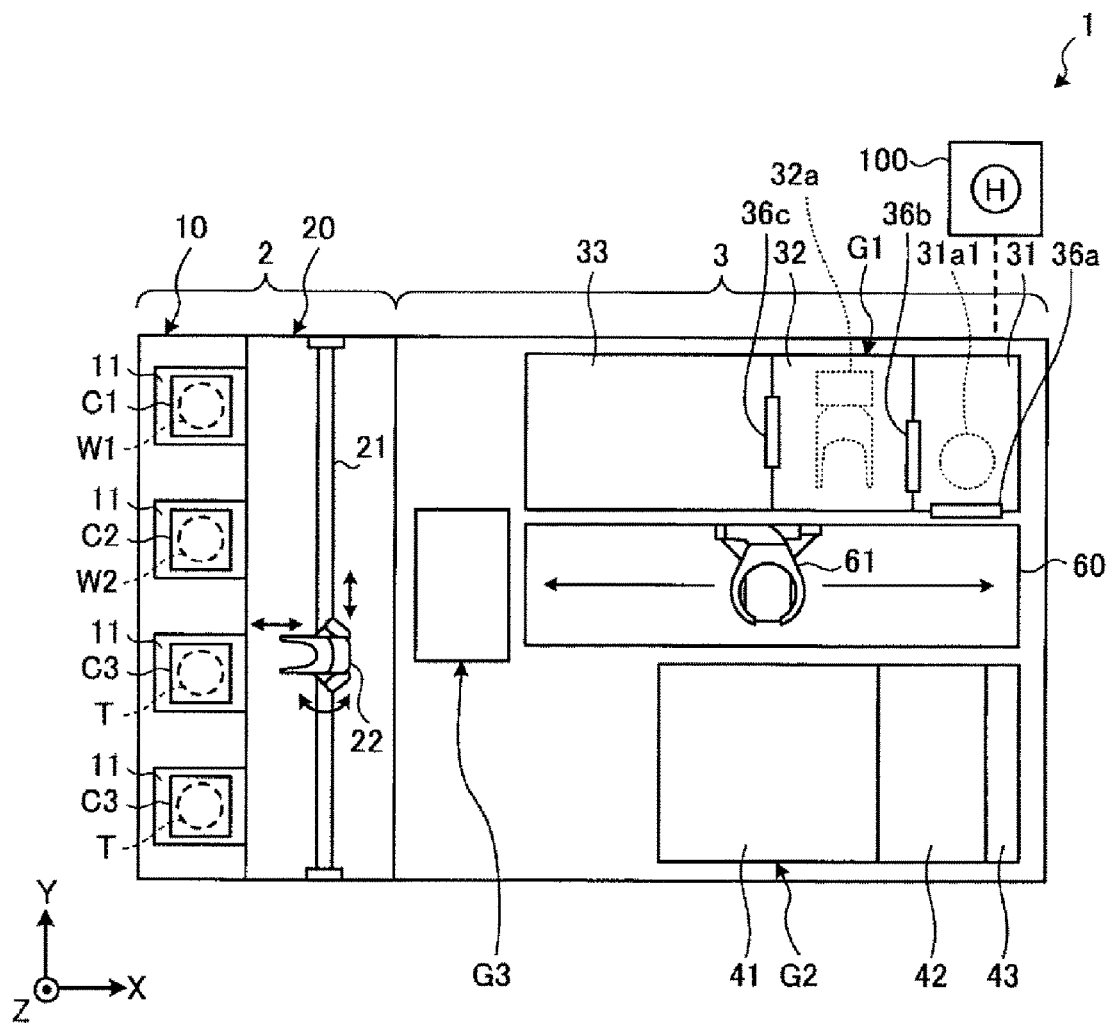
FIG. 1 is a schematic plan view illustrating a configuration of a bonding system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a bonding apparatus of the present disclosure will be explained in detail with reference to the accompanying drawings. It should be noted that the following exemplary embodiments are not intended to be anyway limiting.

1. Configuration of Bonding System

Figure 2:
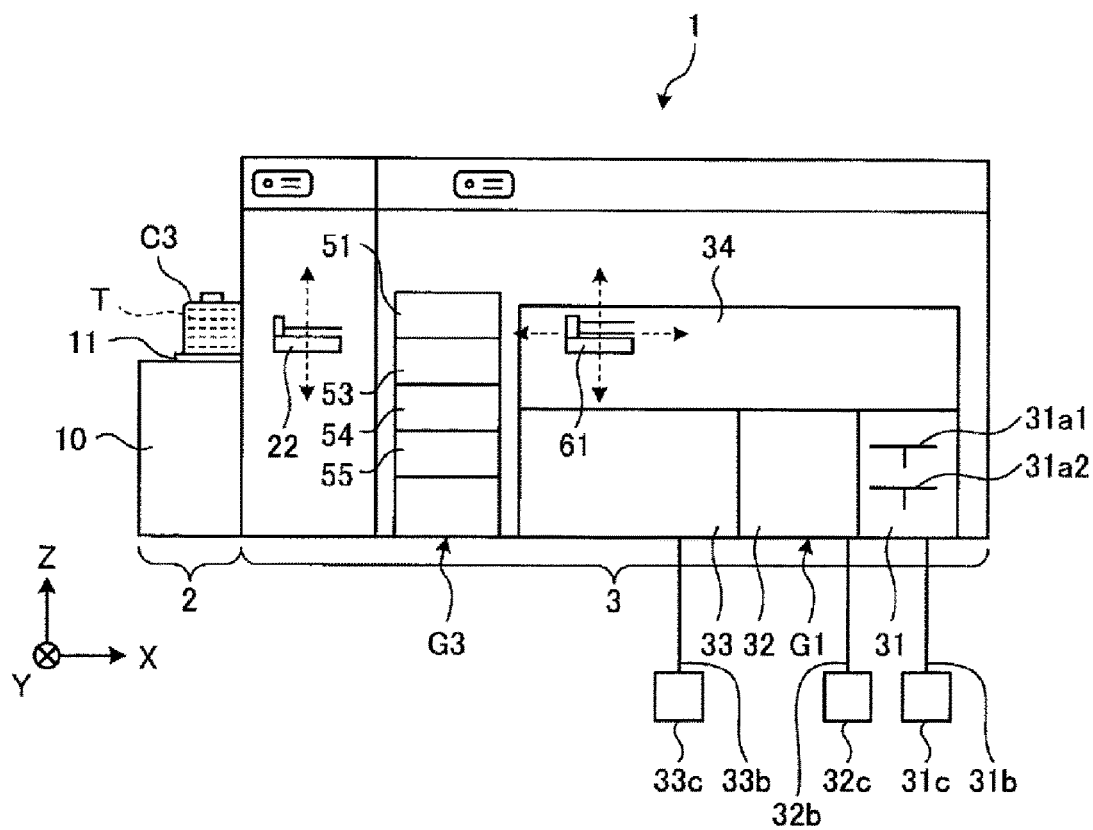
FIG. 2 is a schematic side view illustrating the configuration of the bonding system according to the exemplary embodiment.
Figure 3:
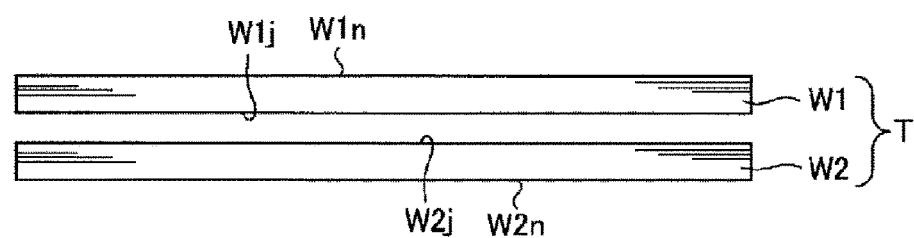
FIG. 3 is a schematic side view of a first substrate and a second substrate.

First, a configuration of a bonding (joining) system according to an exemplary embodiment will be explained with reference to FIG. 1 and FIG. 2. FIG. 1 is a schematic plan view illustrating a configuration of the bonding system according to the exemplary embodiment, and FIG. 2 is a schematic side view thereof. Further, FIG. 3 is a schematic side view of a first substrate and a second substrate. In the following description, in order to clarify positional relationships, the X-axis direction, Y-axis direction and Z-axis direction which are orthogonal to each other will be defined. The positive Z-axis direction will be regarded as a vertically upward direction. Furthermore, in the drawings including FIG. 1 to FIG. 3, only the component parts relevant to the explanation are illustrated, and illustration of general component parts may be omitted.

A bonding system 1 according to the exemplary embodiment shown in FIG. 1 is configured to form a combined substrate T by joining the first substrate W1 and the second substrate W2 to each other (see FIG. 3).

The first substrate W1 is, for example, a semiconductor substrate such as a silicon wafer or a compound semiconductor wafer on which a multiple number of electronic circuits are formed. The second substrate W2 is, for example, a bare wafer on which no electronic circuit is formed. The first substrate W1 and the second substrate W2 have the substantially same diameter.

Further, an electronic circuit may be formed on the second substrate W2. As an example of the aforementioned compound semiconductor wafer, a wafer containing gallium arsenide, silicon carbide, gallium nitride or indium phosphide may be used, but not limited thereto.

In the description that follows, the first substrate W1 may sometimes be referred to as "upper wafer W1"; the second substrate W2, "lower wafer W2"; and the combined substrate T, "combined wafer T."

Further, in the following description, as depicted in FIG. 3, among surfaces of the upper wafer W1, a surface to be bonded to the lower wafer W2 will be referred to as "bonding surface W1j," and a surface opposite to the bonding surface W1j will be referred to as "non-bonding surface W1n." Further, among surfaces of the lower wafer W2, a surface to be bonded to the upper wafer W1 will be referred to as "bonding surface W2j," and a surface opposite to the bonding surface W2j will be referred to as "non-bonding surface W2n."

As shown in FIG. 1, the bonding system 1 includes a carry-in/out station 2 and a processing station 3. The carry-in/out station 2 and the processing station 3 are arranged in this sequence along the positive X-axis direction. Further, the carry-in/out station 2 and the processing station 3 are connected as a single body.

The carry-in/out station 2 includes a placing table 10 and a transfer section 20. The placing table 10 is equipped with a multiple number of placing plates 11. Provided on the placing plates 11 are cassettes C1, C2 and C3 each of which accommodates therein a plurality of (e.g., 25 sheets of) substrates horizontally. The cassette C1 accommodates therein the upper wafers W1; the cassette C2, the lower wafers W2; and the cassettes C3, the combined wafers T. Further, in the cassettes C1 and C2, the upper wafers W1 and the lower wafers W2 are aligned with the bonding surfaces W1j and W2j thereof facing upwards.

A transfer section 20 is provided adjacent to the positive X-axis side of the placing table 10. Provided in the transfer section 20 are a transfer path 21 extended in the Y-axis direction and a transfer device 22 configured to be movable along the transfer path 21. The transfer device 22 is configured to be movable in the X-axis direction as well and pivotable around the Z-axis. Further, the transfer device 22 is also configured to transfer the upper wafers W1, the lower wafers W2 and the combined wafers T between the cassettes C1 to C3 placed on the placing plates 11 and a third processing block G3 of the processing station 3 to be described later.

Further, the number of the cassettes C1 to C3 placed on the placing plates 11 is not limited to the shown example. In addition, besides the cassettes C1 to C3, a cassette or the like for collecting a problematic substrate may be additionally provided on the placing plates 11.

A multiple number of, for example, three processing blocks G1, G2 and G3 equipped with various kinds of devices are provided in the processing station 3. For example, the first processing block G1 is provided at a rear side (positive Y-axis side of FIG. 1) of the processing station 3, and the second processing block G2 is provided at a front side (negative Y-axis side of FIG. 1) of the processing station 3. Further, the third processing block G3 is provided at a side of the carry-in/out station 2 (negative X-axis side of FIG. 1) of the processing station 3.

Furthermore, a transfer section 60 is formed in a region surrounded by the first to third processing blocks G1 to G3. A transfer device 61 is provided in the transfer section 60. The transfer device 61 is equipped with, for example, a transfer arm which is configured to be movable in a vertical direction and a horizontal direction and pivotable around a vertical axis. A detailed description of the transfer device 61 will be explained with reference to FIG. 6A and FIG. 6B.

The transfer device 61 is moved within the transfer section 60 and transfers the upper wafers W1, the lower wafers W2 and the combined wafers T with respect to preset apparatuses within the first processing block G1, the second processing block G2 and the third processing block G3 which are adjacent to the transfer section 60.

Here, the transfer of the upper wafers W1, the lower wafers W2 and the combined wafers T by the transfer device 61 is performed in a normal pressure atmosphere. Here, the normal pressure may be, for example, an atmospheric pressure but may not necessarily be equal to the atmospheric pressure. For example, the normal pressure may have a pressure range of ±10 kPa with respect to the atmospheric pressure. Further, the transfer device 61 is an example of a substrate transfer device.

Disposed in the first processing block G1 are a load lock chamber 31, a transfer chamber 32, a surface modifying apparatus 33 and a surface hydrophilizing apparatus 34 (see FIG. 2).

Within the first processing block G1, the load lock chamber 31 is located at a position farthest spaced apart from the carry-in/out station 2 and is provided adjacent to the positive Y-axis side of the transfer section 60 with a gate valve 36a therebetween. Further, the transfer chamber 32 is provided adjacent to the negative X-axis side of the load lock chamber 31 with a gate valve 36b therebetween. Further, within the first processing block G1, the surface modifying apparatus 33 is located at a position closest to the carry-in/out station 2 and is provided adjacent to the negative X-axis side of the transfer chamber 32 with a gate valve 36c therebetween.

Within the load lock chamber 31, the transfer of the upper wafers W1 and the lower wafers W2 between the transfer device 61 and the surface modifying apparatus 33 is performed. To elaborate, a plurality of transitions 31a1 and 31a2 are provided within the load lock chamber 31 (see FIG. 2). Each of the transitions 31a1 and 31a2 is configured to hold the upper wafer W1 or the lower wafer W2 thereon. By way of example, the transition 31a1 holds thereon the upper wafer W1 or the lower wafer W2 which is carried into the surface modifying apparatus 33 from the transfer device 61, and the transition 31a2 holds thereon the upper wafer W1 or the lower wafer W2 which is carried onto the transfer device 61 from the surface modifying apparatus 33.

Further, as depicted in FIG. 2, the transitions 31a1 and 31a2 are stacked in the vertical direction, but not limited thereto. By way of another example, the transitions 31a1 and 31a2 may be arranged adjacent to each other when viewed from the top. Further, the transitions 31a1 and 31a2 are examples of substrate placing tables.

Further, a vacuum pump 31c (see FIG. 2) is connected to the load lock chamber 31 via a suction line 31b. Accordingly, if the gate valves 36a and 36b, for example, are closed and the vacuum pump 31c is operated, the inside of the load lock chamber 31 is decompressed and turned into a decompressed atmosphere. Meanwhile, if the gate valve 36a, for example, is opened, the inside of the load lock chamber 31 is made to communicate with the transfer section 60 which is under the atmospheric atmosphere, so that the inside of the load lock chamber 31 is turned into the atmospheric atmosphere. As stated, the load lock chamber 31 is configured to switch the inside atmosphere between the atmospheric atmosphere and the decompressed atmosphere.

The transfer chamber 32 is equipped with a transfer device (hereinafter, referred to as "modification transfer device") 32a for the surface modifying apparatus. The modification transfer device 32a has a transfer arm configured to be movable in the vertical direction and the horizontal direction and pivotable around the vertical axis. This modification transfer device 32a serves to receive a non-modified upper wafer W1 or the like placed on the transition 31a1 of the load lock chamber 31 and transfer this received non-modified upper wafer W1 into the surface modifying apparatus 33, or serves to transfer a modified upper wafer W1 or the like processed in the surface modifying apparatus 33 into the load lock chamber 31 and place this modified upper wafer W1 on the transition 31a2 (see FIG. 2).

Further, a vacuum pump 32c (see FIG. 2) is connected to the transfer chamber 32 via a suction line 32b. If the vacuum pump 32c is operated, the inside of the transfer chamber 32 is decompressed and turned into a decompressed atmosphere. Further, the gate valve 36b is configured to be opened when the load lock chamber 31 is under the decompressed atmosphere. Likewise, the gate valve 36c is also configured to be opened when the surface modifying apparatus 33 is under the decompressed atmosphere Therefore, the transfer chamber 32 is always maintained under the decompressed atmosphere by the vacuum pump 32c. As stated, the modification transfer device 32a of the transfer chamber 32 is placed adjacent to the load lock chamber 31, and transfers the upper wafer W1 and the lower wafer W2 under the decompressed atmosphere between the load lock chamber 31 and the surface modifying apparatus 33.

The surface modifying apparatus 33 is configured to modify the bonding surfaces W1j and W2j of the upper wafer W1 and the lower wafer W2. Further, a vacuum pump 33c (see FIG. 2) is connected to the surface modifying apparatus 33 via a suction line 33b. If the vacuum pump 33c is operated, the inside of the surface modifying apparatus 33 is decompressed into a decompressed atmosphere. Like the transfer chamber 32, the surface modifying apparatus 33 is constantly kept in the decompressed atmosphere.

Accordingly, the surface modifying apparatus 33 modifies the bonding surfaces W1j and W2j of the upper wafer W1 and the lower wafer W2 under the decompressed atmosphere. To elaborate, the surface modifying apparatus 33 cuts the $SiO_2$ bond in the bonding surfaces W1j and W2j of the upper wafers W1 and the lower wafer W2, and turns it into SiO of a single bond, so that the bonding surfaces W1j and W2j are modified such that these surfaces are easily hydrophilized afterwards.

Furthermore, in the surface modifying apparatus 33, an oxygen gas as a processing gas is excited into plasma under the decompressed atmosphere and is ionized. As these oxygen ions are irradiated to the bonding surfaces W1j and W2j of the upper wafer W1 and the lower wafer W2, the bonding surfaces W1j and W2j are modified by being plasma-processed.

Moreover, a volume of the inside of the aforementioned load lock chamber 31 is set to be smaller than a volume of the inside of the surface modifying apparatus 33 and the transfer chamber 32, but not limited thereto.

Now, the transfer of the upper wafer W1 in the load lock chamber 31, the transfer chamber 32 and the surface modifying apparatus 33 configured as described above will be explained in detail. Since the transfer of the lower wafer W2 is the same as the transfer of the upper wafer W1, the following description is applied to the transfer of the lower wafer W2. Further, the gate valves 36a, 36b and 36c are all closed.

To elaborate, if a non-modified upper wafer W1 is transferred in front of the load lock chamber 31 by the transfer device 61, the gate valve 36a is opened and then, the non-modified upper wafer W1 is placed on the transition 31a1 of the load lock chamber 31. Further, when the non-modified upper wafer W1 is placed on the transition 31a1, an upper wafer W1 or a lower wafer W2 already modified in a previous processing may be placed on the transition 31a2. In such a case, after the transfer device 61 places the non-modified upper wafer W1 on the transition 31a1, the transfer device 61 may receive the upper wafer W1 or the lower wafer W2 placed on the transition 31a2 and carry the received wafer out of the load lock chamber 31.

Subsequently, the gate valve 36a is closed and the vacuum pump 31c is operated, so that the load lock chamber 31 is decompressed into the decompressed atmosphere.

Thereafter, the gate valves 36b and 36c are opened, and the modification transfer device 32a transfers the upper wafer W1 placed on the transition 31a1 into the surface modifying apparatus 33. Then, the gate valves 36b and 36c are closed, and a modification processing is performed on the upper wafer W1 in the surface modifying apparatus 33.

Upon the completion of the modification processing, the gate valves 36b and 36c are opened, and the modification transfer device 32a takes out the upper wafer W1 from the surface modifying apparatus 33 and transfers it onto the transition 31a2 of the load lock chamber 31. Subsequently, after the gate valves 36b and 36c are closed, the gate valve 36a is opened, so that the inside of the load lock chamber 31 is turned into the atmospheric atmosphere from the decompressed atmosphere.

Then, the transfer device 61 withdraws the modified upper wafer W1 from the transition 31a2 of the load lock chamber 31 and transfers the modified upper wafer W1 into the surface hydrophilizing apparatus 34 in which a next processing is performed.

As stated above, the bonding system 1 according to the present exemplary embodiment is equipped with the load lock chamber 31 in which the upper wafer W1 and the lower wafer W2 are transferred between the transfer device 61 and the surface modifying apparatus 33. The inside of the load lock chamber 31 is switchable between the atmospheric atmosphere and the decompressed atmosphere.

Accordingly, in the bonding system 1, a processing time for the upper wafer W1 and the lower wafer W2 can be shortened. That is, if the internal pressure of the load lock chamber 31 is set to be changed when the upper wafer W1 and the lower wafer W2 is carried into or carried out of the surface modifying apparatus 33, it is possible to perform the modification processing in the surface modifying apparatus 33 while the surface modifying apparatus 33 is kept in the decompressed atmosphere. Thus, since a processing of turning the atmospheric atmosphere into the decompressed atmosphere is not required in the surface modifying apparatus 33, the processing time of the modification processing of the upper wafer W1 and the lower wafer W2 can be reduced.

Moreover, the volume of the inside of the load lock chamber 31 is set to be smaller than the volume of the inside of the surface modifying apparatus 33 and the transfer chamber 32. Accordingly, a time required to change the internal pressure of the load lock chamber 31 can be shortened as compared to a time required to change the internal pressure of the surface modifying apparatus 33.

In addition, the modification transfer device 32a is not provided within the load lock chamber 31 but provided adjacent to the load lock chamber 31. Accordingly, as compared to the configuration where the modification transfer device 32a is disposed within the load lock chamber 31, the load lock chamber 31 can be reduced in size, so that the time required to change the internal pressure thereof can be further reduced.

The surface hydrophilizing apparatus 34 (see FIG. 2) is configured to hydrophilize the bonding surfaces W1j and W2j of the upper wafer W1 and the lower wafer W2 with a hydrophilizing liquid such as, but not limited to, pure water and then clean the bonding surfaces W1j and W2j. In the surface hydrophilizing apparatus 34, while rotating the upper wafer W1 or the lower wafer W2 held by, for example, a spin chuck, the pure water is supplied onto the upper wafer W1 or the lower wafer W2. Accordingly, the pure water supplied onto the upper wafer W1 or the lower wafer W2 is diffused onto the bonding surfaces W1j and W2j of the upper wafer W1 or the lower wafer W2, so that the bonding surfaces W1j and W2j are hydrophilized.

As depicted in FIG. 2, in the first processing block G1, the load lock chamber 31, the transfer chamber 32, the surface modifying apparatus 33 and the surface hydrophilizing apparatus 34 are stacked. For example, in the first processing block G1, the load lock chamber 31, the transfer chamber 32 and the surface modifying apparatus 33 are arranged at a lower end of the first processing block G1 in the negative Z-axis direction, whereas the surface hydrophilizing apparatus 34 is disposed at an upper end of the first processing block G1 in the positive Z-axis direction.

As stated above, in the present exemplary embodiment, the load lock chamber 31, the transfer chamber 32 and the surface modifying apparatus 33 are disposed under the surface hydrophilizing apparatus 34. With this configuration, for example, the vacuum pumps 31c, 32c and 33c and the suction lines 31b, 32b and 33b respectively connected to the load lock chamber 31, the transfer chamber 32 and the surface modifying apparatus 33 can be all disposed in the lower portion of the bonding system 1, so that the entire system can be scaled down.

Further, since the vacuum pumps 31c, 32c and 33c are respectively disposed in the vicinity of the load lock chamber 31, the transfer chamber 32 and the surface modifying apparatus 33, the suction lines 31b, 32b and 33b can be shortened. Therefore, a time required for the evacuation can be minimized.

Moreover, the locations of the load lock chamber 31, the surface modifying apparatus 33 and the surface hydrophilizing apparatus 34 are not limited to the example shown in FIG. 1. That is, the load lock chamber 31 and the surface modifying apparatus 33 may be disposed above the surface hydrophilizing apparatus 34. By way of still another example, the load lock chamber 31 and the surface modifying apparatus 33 may be placed in the second processing block G2 or the third processing block G3. Besides, a new station may be provided at a position at the positive X-axis side of the processing station 3 or between the carry-in/out station 2 and the processing station 3, and the load lock chamber 31 and the surface modifying apparatus 33 may be disposed in this new station.

The second processing block G2 is equipped with a bonding apparatus 41, a substrate temperature adjusting apparatus 42 and a gas exhaust port 43. Within the second processing block G2, the bonding apparatus 41 is located at a position closest to the carry-in/out station 2. Further, the substrate temperature adjusting apparatus 42 is disposed adjacent to the bonding apparatus 41 at the positive X-axis side thereof. Further, the substrate temperature adjusting apparatus 42 is also disposed adjacent to the gas exhaust port 43 at the negative X-axis side thereof.

The bonding apparatus 41 is configured to bond the upper wafer W1 and lower wafer W2 which are hydrophilized by an intermolecular force. A detailed configuration of the bonding apparatus 41 will be described later with reference to FIG. 8 to FIG. 17H.

The substrate temperature adjusting apparatus 42 is configured to individually adjust temperatures of the upper wafer W1 before bonded and the lower wafer W2 before bonded. A detailed description of the substrate temperature adjusting apparatus 42 will be described later with reference to FIG. 7.

The gas exhaust port 43 exhausts a temperature-adjusted gas (hereinafter, referred to as "temperature control air"). That is, though not shown, the processing station 3 includes a gas supply port provided at an appropriate position such as a ceiling portion thereof at the carry-in/out station 2 side and configured to supply the temperature control air, for example. Further, the gas exhaust port 43 exhausts the temperature control air having passed through the processing station 3 after being supplied from the gas supply port to the outside of the processing station 3.

In the processing station 3, the bonding apparatus 41, the substrate temperature adjusting apparatus 42 and the gas exhaust port 43 are arranged in sequence in a flow direction of the temperature control air (i.e., in the positive X-axis direction). That is to say, the substrate temperature adjusting apparatus 42 is disposed downstream of the bonding apparatus 41 in the flow direction of the temperature control air.

Further, the location of the gas exhaust port 43 is not limited to the shown example, and the gas exhaust port 43 may be disposed at another position such as near the load lock chamber 31 or near the transfer section 60. In addition, the location of the gas supply port may not be limited to the shown example, either. By way of example, the gas supply port may be provided at another position such as a bottom or a wall portion of the processing station 3.

As depicted in FIG. 2, the third processing block G3 includes a position adjusting apparatus 51, transitions 53 and 54 and an inverting transition 55 which are stacked in sequence from the top. However, it should be noted that these locations of the individual apparatuses within the third processing block G3 are nothing more than examples and are not intended to be limiting.

Figure 4:
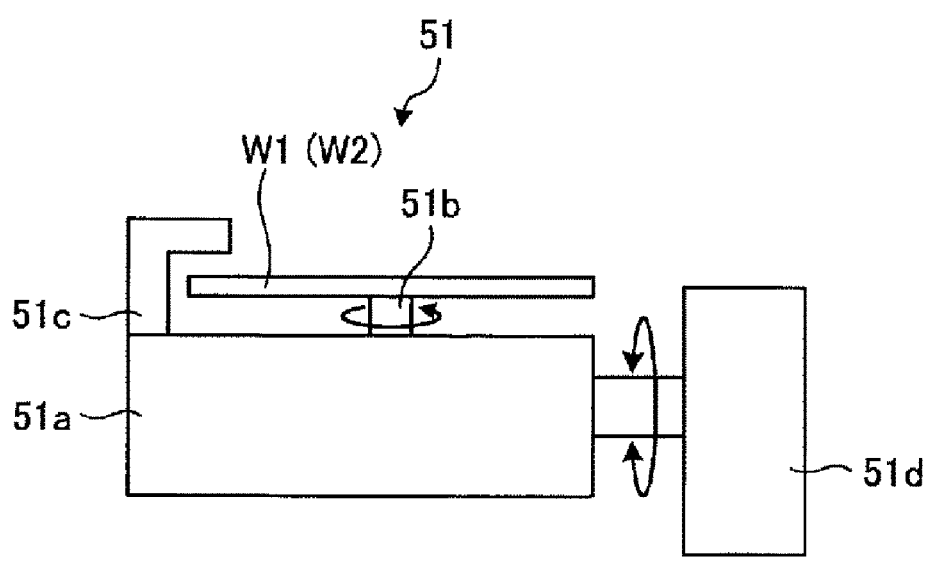
FIG. 4 is a schematic side view illustrating a configuration of a position adjusting device.

FIG. 4 is a schematic side view illustrating a configuration of the position adjusting apparatus 51. The position adjusting apparatus 51 is configured to adjust horizontal directions of the upper wafer W1 and the lower wafer W2. The position adjusting apparatus 51 includes, as illustrated in FIG. 4, a base 51a; a holding unit 51b configured to attract/hold and rotate the upper wafer W1 and the lower wafer W2; a detecting unit 51c configured to detect positions of notches of the upper wafer W1 and the lower wafer W2; and a base inverting unit 51d configured to invert the base 51a.

In this position adjusting apparatus 51, while rotating the upper wafer W1 and the lower wafer W2 attracted to and held by the holding unit 51b, the positions of the notches of the upper wafer W1 and the lower wafer W2 are detected by the detecting unit 51. Accordingly, by adjusting the positions of the notches, the horizontal directions of the upper wafer W1 and the lower wafer W2 are adjusted.

Further, the detecting unit 51c may be provided with, for example, a non-illustrated camera configured to image edges of the upper wafer W1 and the lower wafer W2. The detecting unit 51c may be configured to image the edge of the upper wafer W1 or the like while rotating the upper wafer W1 or the like held by the holding unit 51b one round and plot the edge of the upper wafer W1 or the like based on the obtained images. The detecting unit 51c is also configured to detect radii of the upper wafer W1 and the lower wafer W2 based on the plotted information of the edge of the upper wafer W1 or the like.

As stated above, the position adjusting apparatus 51 also serves as a radius detecting apparatus capable of detecting the radii of the upper wafer W1 and the lower wafer W2. Further, in the above description, though the position adjusting apparatus 51 detects the radius of the upper wafer W1 or the like, the exemplary embodiment is not limited thereto. By way of example, identification information (ID) indicating the radius may be assigned to the upper wafer W1 or the like, and the radius may be detected by reading this identification information.

The base inverting unit 51d may include, for example, a motor and is connected to the base 51a and configured to invert the base 51a along with the upper wafer W1 held by the holding unit 51b. Accordingly, front and rear surfaces of the upper wafer W1 held by the holding unit 51b are inverted. Through this inversion, the upper wafer W1, the horizontal direction of which is adjusted, is turned into a state (see FIG. 3) where the bonding surface W1j thereof faces downwards, and then is carried out of the position adjusting apparatus 51 in this inverted state. Further, the upper wafer W1 and the lower wafer W2 carried out from the position adjusting apparatus 51 are transferred into the substrate temperature adjusting apparatus 42 and then the temperature thereof are adjusted.

Referring back to FIG. 2, the upper wafer W1 transferred by the transfer device 22 or the transfer device 61 is temporarily placed on the transition 53. Further, the lower wafer W2 or the combined wafer T transferred by the transfer device 22 or the transfer device 61 is temporarily placed on the transition 54.

The inverting transition 55 is configured to temporarily hold the upper wafer W1 or the lower wafer W2, which is returned from the bonding apparatus 41 with the bonding surface W1j or W2j facing downwards without being bonded in the bonding apparatus 41 for any reason. Further, the inverting transition 55 is an example of a substrate transfer device.

Figure 5A:
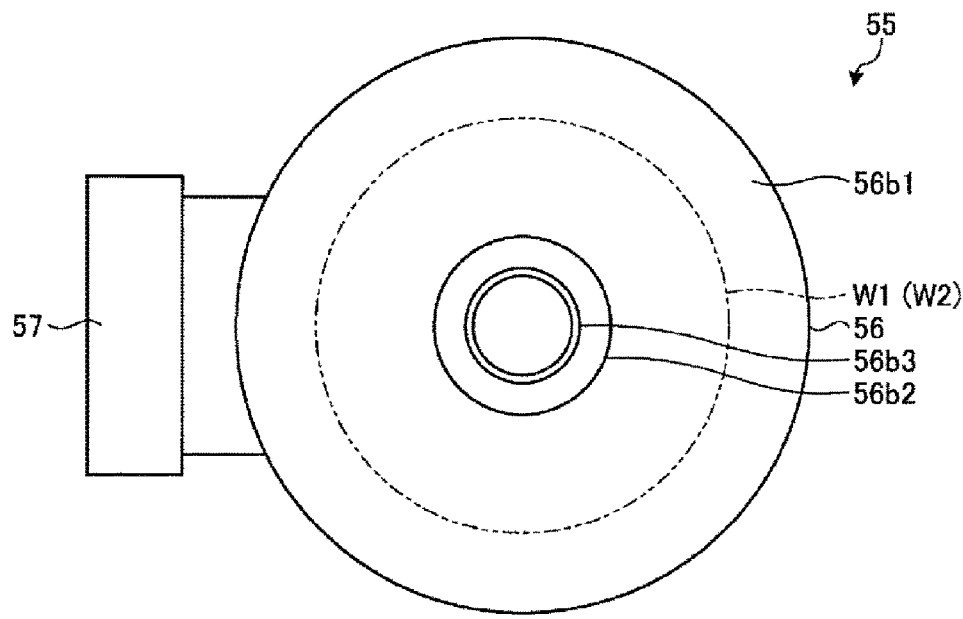
FIG. 5A is a schematic plan view illustrating a configuration of an inverting transition.
Figure 5B:
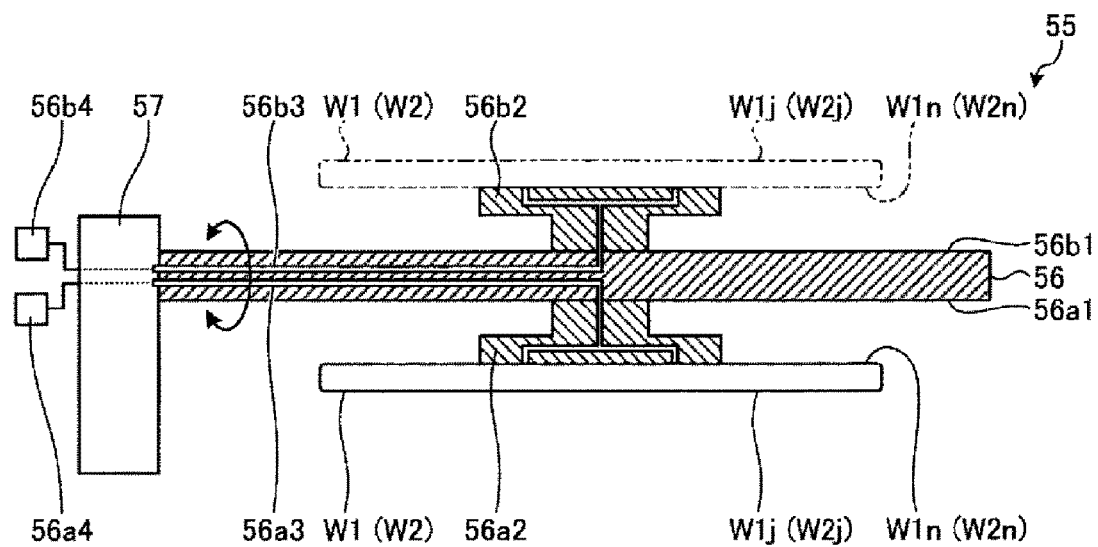
FIG. 5B is a schematic side view illustrating a configuration of the inverting transition.

FIG. 5A is a schematic plan view illustrating a configuration of the inverting transition 55, and FIG. 5B is a schematic side view illustrating a configuration of the inverting transition 55. As depicted in FIG. 5B, the inverting transition 55 is equipped with a holder 56 and an inverting mechanism 57. The holder 56 holds, at the side of a bottom surface 56a1 thereof, the upper wafer W1 (the lower wafer W2) with the bonding surface W1j (W2j) facing downwards.

To elaborate, the holder 56 includes an attracting unit 56a2 provided at the side of the bottom surface 56a1 thereof. The attracting unit 56a2 is connected to a vacuum pump 56a4 via a suction line 56a3. Accordingly, as the vacuum pump 56a4 is operated, the bottom surface 56a1 of the holder 56 holds the upper wafer W1 or the lower wafer W2 by vacuum attraction. Thus, the holder 56 is capable of holding the upper wafer W1 or the like securely.

Furthermore, the holder 56 also includes an attracting unit 56b2 provided at the side of a top surface 56b1 of the holder 56. The attracting unit 56b2 is connected to a vacuum pump 56b4 via a suction line 56b3. Accordingly, the top surface 56b1 of the holder 56 is configured to attract the upper wafer W1 or the like as the vacuum pump 56b4 is operated.

The inverting mechanism 57 includes, for example, a motor or the like and is connected to the holder 56 and configured to invert the front and rear surfaces of the upper wafer W1 held by the holding unit 56. Here, for example, the inverting mechanism 57 of the inverting transition 55 inverts the upper wafer W1 which has not been bonded by the bonding apparatus 41.

To elaborate, the upper wafer W1 and the lower wafer W2 may not be joined in the bonding apparatus 41 for any reason, and the upper wafer W1 with the bonding surface W1j facing downwards may be returned back into the third processing block G3. In such a case, the upper wafer W1 with the bonding surface W1j facing downwards is transferred to the inverting transition 55 by the transfer device 61 and is held by the attracting unit 56a2 from the non-bonding surface W1n side thereof. Then, the inverting mechanism 57 inverts the holder 56, so that the upper wafer W1 is turned into a state in which the bonding surface W1j faces upwards. The upper wafer W1 in this state is indicated by imaginary lines in FIG. 5A and FIG. 5B.

Accordingly, the upper wafer W1 returned without being bonded in the bonding apparatus 41 can be turned into the same state as accommodated in the cassette C1, that is, into the state where the bonding surface W1j faces upwards as indicated by the imaginary line in FIG. 5B. As stated above, the inverting transition 55 is capable of easily inverting the front and rear surfaces of the upper wafer W1 which is maintained with the bonding surface W1j thereof facing downwards. The upper wafer W1 with the bonding surface W1j facing upwards can be then transferred to and accommodated in the cassette C1 by the transfer device 22.

Figure 6A:
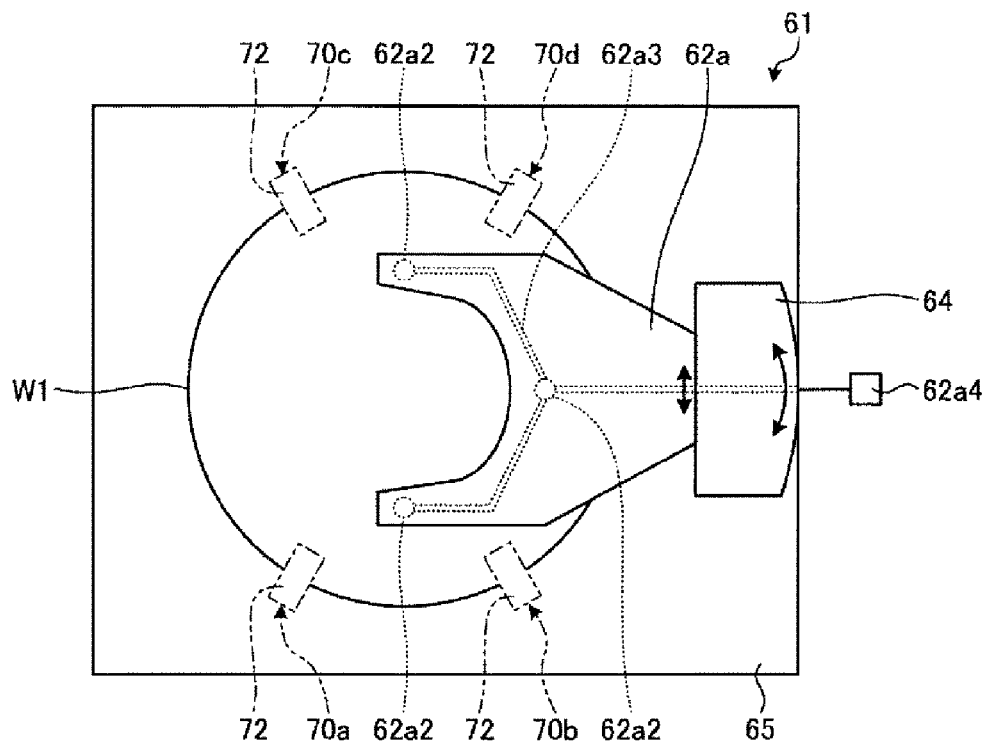
FIG. 6A is a schematic plan view illustrating a configuration of a transfer device.
Figure 6B:
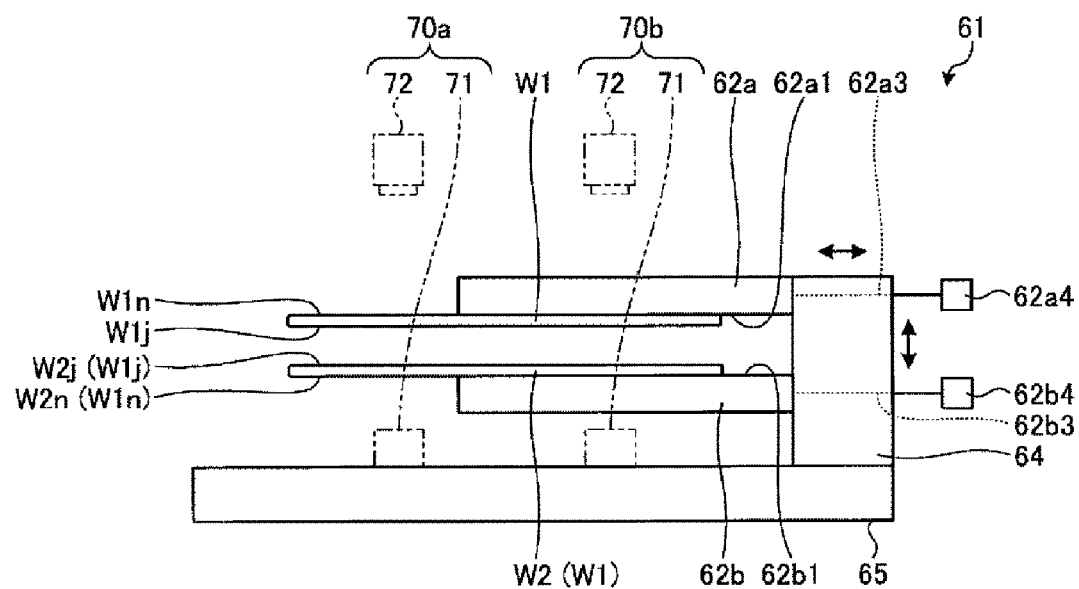
FIG. 6B is a schematic side view illustrating the configuration of the transfer device.

Now, a configuration of the transfer device 61 will be elaborated with reference to FIG. 6A and FIG. 6B. FIG. 6A is a schematic plan view illustrating the configuration of the transfer device 61, and FIG. 6B is a schematic side view illustrating the configuration of the transfer device 61.

As depicted in FIG. 6B, the transfer device 61 includes a first holding unit 62a; a second holding unit 62b provided under the first holding unit 62a to face the first holding unit 62a; and a first driving unit 64. Further, each of the first holding unit 62a and the second holding unit 62b may be implemented by a bifurcated fork having a transversal width smaller than the diameter of the upper wafer W1 or the like, but not limited thereto.

In the present exemplary embodiment, the first holding unit 62a is used to hold the upper wafer W1 with the bonding surface W1j facing downwards. Meanwhile, the second holding unit 62b is used to hold the lower wafer W2 with the bonding surface W2j facing upwards, the upper wafer W1 with the bonding surface W1j facing upwards and the combined wafer T. Further, the kinds of the wafers held by the first holding unit 62a and the second holding unit 62b are not limited to the aforementioned examples, and the first holding unit 62a may configured to hold the combined wafer T, for example.

The first holding unit 62a is provided with a multiple number of attracting portions 62a2 (indicated by dashed lines in FIG. 6A) on a bottom surface 62a1 thereof. The attracting portions 62a2 are connected to a vacuum pump 62a4 via a suction line 62a3. Accordingly, the first holding unit 62a holds the upper wafer W1 by vacuum attraction through an operation of the vacuum pump 62a4. To be specific, the first holding unit 62a holds the upper wafer W1 with the bonding surface W1j facing downwards by vacuum attraction from the side of the non-bonding surface W1n (top surface) thereof.

The second holding unit 62b is provided with a multiple number of attracting portions (not illustrated in FIG. 6A and FIG. 6B) on a top surface thereof 62b1. The attracting portions are connected to a vacuum pump 62b4 via a suction line 62b3 (see FIG. 6B). Accordingly, the second holding unit 62b holds the lower wafer W2 or the like by vacuum attraction through an operation of the vacuum pump 62b4.

To elaborate, the second holding unit 62b holds the lower wafer W2 with the bonding surface W2j facing upwards by vacuum attraction from the side of the non-bonding surface W2n (bottom surface) thereof such that the lower wafer W2 faces the upper wafer W1. Furthermore, though not shown, the second holding unit 62b holds the combined wafer T by vacuum attraction as stated above.

As described above, the first holding unit 62a holds the upper wafer W1 by the vacuum attraction, and the second holding unit 62b holds the lower wafer W2 by the vacuum attraction. Accordingly, the first holding unit 62a and the second holding unit 62b are capable of holding the upper wafer W1 and the lower wafer W2 securely.

The first driving unit 64 is connected to the first holding unit 62a and the second holding unit 62b. The first driving unit 64 is configured to drive the first holding unit 62a and the second holding unit 62b together and move the first holding unit 62a and the second holding unit 62b as one body in the vertical direction and the horizontal direction with respect to a base 65 and around the vertical axis. Further, the first driving unit 64 includes, though not shown, a driving source such as a motor and a power transmission mechanism such as a belt.

By being configured as described above, the transfer device 61 can be reduced in size. That is, for example, if individual driving units are respectively connected to the first holding unit 62a and the second holding unit 62b, two driving units are required, and the transfer device 61 is scaled up. In the transfer device 61 according to the present exemplary embodiment, however, the first holding unit 62a and the second holding unit 62b are driven by the single driving unit 64, so that the transfer device 61 can be scaled down.

Moreover, in case of transferring the upper wafer W1 and the lower wafer W2 into the bonding apparatus 41, the transfer device 61 holds the upper wafer W1 with the first holding unit 62a and the lower wafer W2 with the second holding unit 62b, and transfers the two of the upper wafer W1 and the lower wafer W2 together.

To elaborate, as depicted in FIG. 6B, the first holding unit 62a holds the upper wafer W1, which is maintained with the bonding surface W1j facing downwards, from the top surface side thereof, and the second holding unit 62b holds the lower wafer W2, which is maintained with the bonding surface W2j facing upwards, from the bottom surface side thereof such that the lower wafer W2 faces the upper wafer W1.

Accordingly, in the bonding apparatus 41, the upper wafer W1 and the lower wafer W2 are transferred while being kept in the same directions as in performing the bonding processing. Therefore, in the bonding apparatus 41, the processing of inverting the direction of, for example, the upper wafer W1 need not be performed, so that the processing time of the bonding processing in the bonding apparatus 41 can be shortened.

Moreover, the transfer device 61 is equipped with a plurality of (here, four) position detectors 70a to 70d. The position detectors 70a to 70d are fixed to, for example, the base 65. The position detectors 70a to 70d are configured to detect positions of the edge of the upper wafer W1 held by the first holding unit 62a and the lower wafer W2 held by the second holding unit 62b at different positions.

To elaborate, each of the position detectors 70a to 70d includes a light projecting part 71 and a light receiving part 72. The light projecting part 71 and the light receiving part 72 are located at a lower position and an upper position, respectively, with the upper wafer W1 held by the first holding unit 62a and the lower wafer W2 held by the second holding unit 62b therebetween. That is, the position detectors 70a to 70d are arranged vertically to the surfaces (e.g., the bonding surfaces W1j and W2j and the non-bonding surfaces W1n and W2n) of the upper wafer W1 held by the first holding unit 62a and the lower wafer W2 held by the second holding unit 62b.

The arrangement of the light projecting part 71 and the light receiving part 72 is not limited to the aforementioned example. By way of example, the light projecting part 71 may be positioned above the upper wafer W1 or the like, and the light receiving part 72 may be provided under the upper wafer W1 or the like. Further, the light receiving part 72 may be implemented by, by way of example, but not limitation, a line sensor in which a multiple number of light receiving elements are arranged in a straight line shape.

The light receiving part 72 receives light irradiated from the light projecting part 71 with the light receiving elements. If, however, the upper wafer W1 or the like is disposed between the light projecting part 71 and the light receiving part 72, the light is partially blocked by the upper wafer W1 or the like.

Accordingly, in the light receiving part 72, there is generated a difference in a light receiving amount between the light receiving elements that have received the light and the light receiving elements that have not received the light. Each of the position detectors 70a to 70d detects the position of the edge of the upper wafer W1 or the like based on such a difference of the light receiving amount. The position detectors 70a to 70d send signals indicating the detection results to the control device 100 (see FIG. 1) to be described later. A processing of detecting the position of the edge of the upper wafer W1 or the like by the position detectors 70a to 70d will be explained later.

Referring back to FIG. 1, the bonding system 1 includes the control device 100. The control device 100 controls an operation of the bonding system 1. The control device 100 may be implemented by, for example, a computer and includes a non-illustrated controller and a non-illustrated storage unit. The storage unit stores therein a program for controlling various processings such as a bonding processing or data for use in the various processings. The controller controls the operation of the bonding system 1 by reading and executing a program or the like stored in the storage unit.

Further, the program may be recorded in a computer-readable recording medium and installed from the recording medium to the storage unit of the control device 100. The computer-readable recording medium may be, by way of non-limiting example, a hard disc (HD), a flexible disc (FD), a compact disc (CD), a magnet optical disc (MO), or a memory card.

Figure 7:
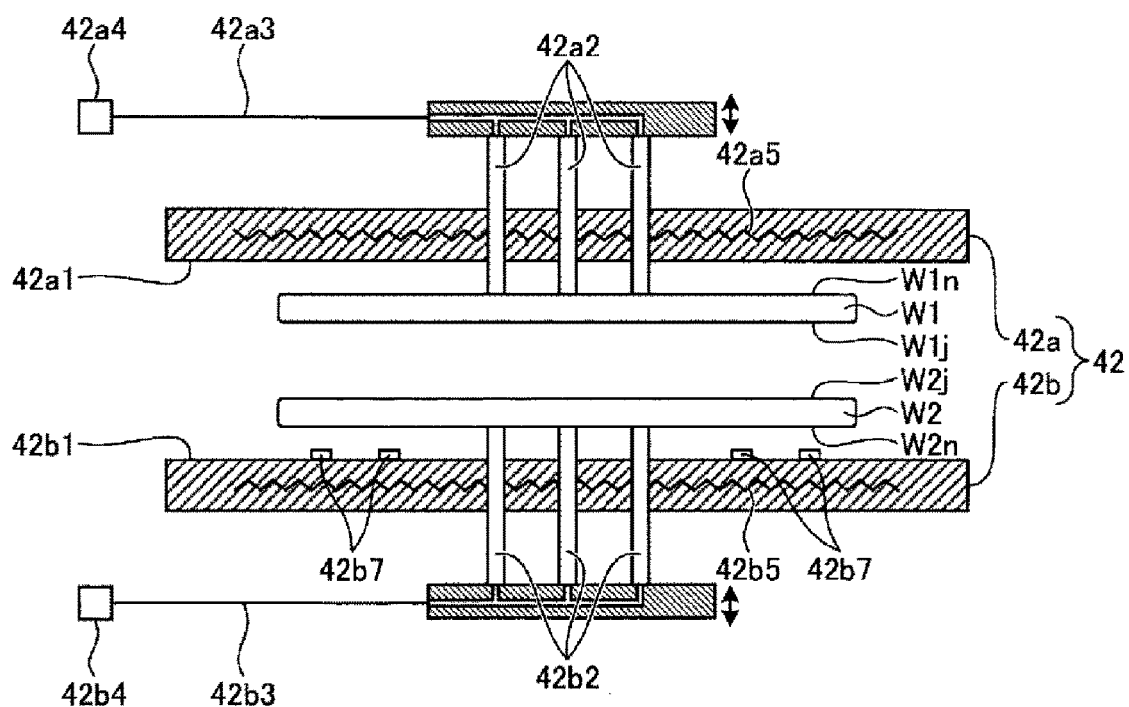
FIG. 7 is a schematic side view illustrating a configuration of a substrate temperature adjusting device.

Here, the aforementioned substrate temperature adjusting apparatus 42 will be elaborated with reference to FIG. 7. FIG. 7 is a schematic side view illustrating a configuration of the substrate temperature adjusting apparatus 42.

The upper wafer W1 with the bonding surface W1j facing downwards and the lower wafer W2 with the bonding surface W2j facing upwards are transferred into the substrate temperature adjusting apparatus 42 by the transfer device 61, and the temperatures of the upper wafer W1 and the lower wafer W2 are adjusted individually. To elaborate, as shown in FIG. 7, the substrate temperature adjusting apparatus 42 includes a first temperature adjusting plate 42a and a second temperature adjusting plate 42b.

The first temperature adjusting plate 42a is configured to hold the upper wafer W1 before bonded, specifically, the upper wafer W1 which is not bonded yet after being hydrophilized. To elaborate, the first temperature adjusting plate 42a is provided with a plurality of holding pins 42a2 on a holding surface 42a1 thereof which holds the upper wafer W1. The holding pins 42a2 are configured to be movable up and down with respect to the holding surface 42a1 of the first temperature adjusting plate 42a.

Further, the holding pins 42a2 are connected to a vacuum pump 42a4 via a suction line 42a3. Accordingly, as the vacuum pump 42a4 is operated, the first temperature adjusting plate 42a holds the upper wafer W1 by vacuum attraction. Further, the non-bonding surface W1n of the upper wafer W1 is attracted to and held by the holding pins 42a2 of the first temperature adjusting plate 42a.

Furthermore, the first temperature adjusting plate 42a has a first temperature adjusting mechanism 42a5 embedded therein. A coolant such as temperature-adjusted cooling water is flown in the first temperature adjusting mechanism 42a5. Accordingly, the first temperature adjusting plate 42a adjusts the temperature of the upper wafer W1 by adjusting a cooling temperature of the first temperature adjusting mechanism 42a5, or by adjusting a distance between the first temperature adjusting plate 42a and the upper wafer W1 by moving the holding pins 42a2 up and down.

The second temperature adjusting plate 42b is disposed such that a holding surface 42b1 thereof faces the holding surface 42a1 of the first temperature adjusting plate 42a, and is configured to hold the lower wafer W2 before bonded, specifically, the lower wafer W2 which is not bonded yet after being hydrophilized. To elaborate, the second temperature adjusting plate 42b is provided with a plurality of holding pins 42b2 on the holding surface 42b1 which holds the lower wafer W2. The holding pins 42b2 are configured to be movable up and down with respect to the holding surface 42b1 of the second temperature adjusting plate 42b.

Further, the holding pins 42b2 are connected to a vacuum pump 42b4 via a suction line 42b3. Accordingly, as the vacuum pump 42b4 is operated, the second temperature adjusting plate 42b holds the lower wafer W2 by vacuum attraction. Further, the non-bonding surface W2n of the lower wafer W2 is attracted to and held by the holding pins 42b2. Further, in the above description, though the second temperature adjusting plate 42b holds the lower wafer W2 by the attraction, the exemplary embodiments are not limited thereto. By way of example, the vacuum pump 42b4 and the suction line 42b3 may be omitted, and the second temperature adjusting plate 42b may hold the lower wafer W2 by placing the lower wafer W2 thereon.

Furthermore, the second temperature adjusting plate 42b has a second temperature adjusting mechanism 42b5 embedded therein. For example, a coolant is flown in the second temperature adjusting mechanism 42b5. Further, a plurality of proximity pins 42b7 capable of supporting the lower wafer W2 are provided on the holding surface 42b1 of the second temperature adjusting plate 42b.

In the second temperature adjusting plate 42b having the above-described configuration, the lower wafer W2 transferred thereto is held by the holding pins 42b2, and the holding pins 42b are then lowered until tip ends of the holding pins 42b2 become lower than the proximity pins 42b7. Accordingly, the lower wafer W2 are supported by the proximity pins 42b7, and an appropriate clearance is obtained between the lower wafer W2 and the holding surface 42b1 of the second temperature adjusting plate 42b. As stated, the second temperature adjusting plate 42b adjusts the temperature of the lower wafer W2 in the state that the appropriate distance is maintained between the second temperature adjusting plate 42b and the lower wafer W2.

Further, though the proximity pins 42b7 are used in the above-described second temperature adjusting plate 42b, the exemplary embodiment is not limited thereto. For example, the proximity pins 42b7 may be omitted, and by lowering the holding pins 42b2 to a position where an appropriate distance is kept between the lower wafer W2 and the second temperature adjusting plate 42b, the temperature of the lower wafer W2 may be adjusted.

The first and second temperature adjusting mechanisms 42a5 and 42b5 may be implemented by cooling jackets. However, the exemplary embodiment is not limited thereto, and another kind of temperature adjusting mechanism such as a heater may be used.

The substrate temperature adjusting apparatus 42 having the above-described configuration controls the temperature of the lower wafer W2 before bonded to be higher than the temperature of the upper wafer W1 before bonded. Accordingly, scaling can be suppressed.

In the combined wafer T, for example, the scaling is a phenomenon that peripheries of the upper wafer W1 and the lower wafer W2 are deviated in the horizontal direction even when centers of the upper wafer W1 and the lower wafer W2 are coincident. This phenomenon occurs because the upper wafer W1 is bent in a convex shape downwardly since a central portion W1a of the upper wafer W1 is lowered down toward a center portion W2a of the lower wafer W2 by a push member 250 (see FIG. 17D) when the upper wafer W1 and the lower wafer W2 are bonded, as will be described later.

In the substrate temperature adjusting apparatus 42 according to the present exemplary embodiment, by adjusting the temperature of the lower wafer W2 before bonded to be higher than the temperature of the upper wafer W1 before bonded, the lower wafer W2 is expanded. Accordingly, the position deviation (scaling) of the peripheries of the upper wafer W1 and the lower wafer W2 in the horizontal direction can be effectively suppressed.

Moreover, in the above description, the substrate temperature adjusting apparatus 42 performs the temperature adjustment such that the temperature of the lower wafer W2 before bonded is higher than the temperature of the upper wafer W1 before bonded. However, the exemplary embodiment is not limited thereto, and the lower wafer W2 and the upper wafer W1 may be controlled to have the same temperature, for example.

Furthermore, in the above description, the substrate temperature adjusting apparatus 42 is configured to adjust the temperatures of both the upper wafer W1 and the lower wafer W2. However, the exemplary embodiment is not limited thereto, and the substrate temperature adjusting apparatus 42 may be configured to adjust the temperature of either the upper wafer W1 or the lower wafer W2.

In addition, as stated above, the substrate temperature adjusting apparatus 42 is disposed downstream of the bonding apparatus 41 in the flow direction of the temperature control air (see FIG. 1). Accordingly, ambient temperature environment around the substrate temperature adjusting apparatus 42 and the bonding apparatus 41 become same. Therefore, when the upper wafer W1 and the lower wafer W2, the temperatures of which are adjusted by the substrate temperature adjusting apparatus 42, are transferred to the bonding apparatus 41, such an influence from the ambient temperature environment as a decrease of the temperatures of the wafers or the like can be suppressed. Hence, the temperature management of the upper wafer W1 and the lower wafer W2 can be easily achieved.

2. Configuration of Bonding Apparatus

Figure 8:
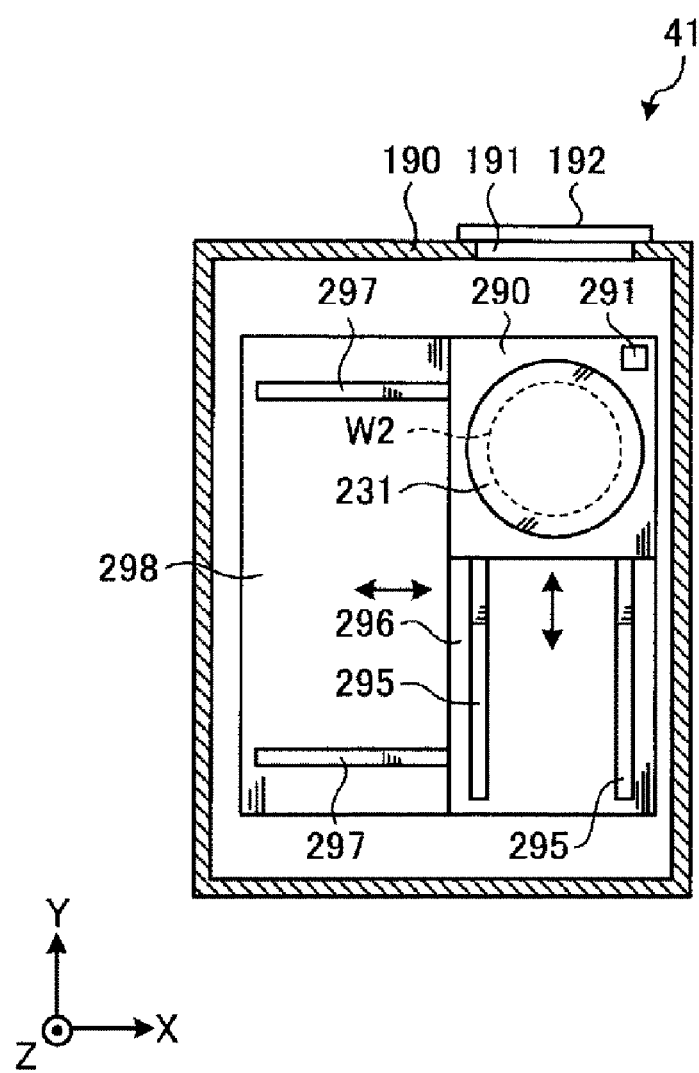
FIG. 8 is a schematic plan view illustrating a configuration of a bonding apparatus.
Figure 9:
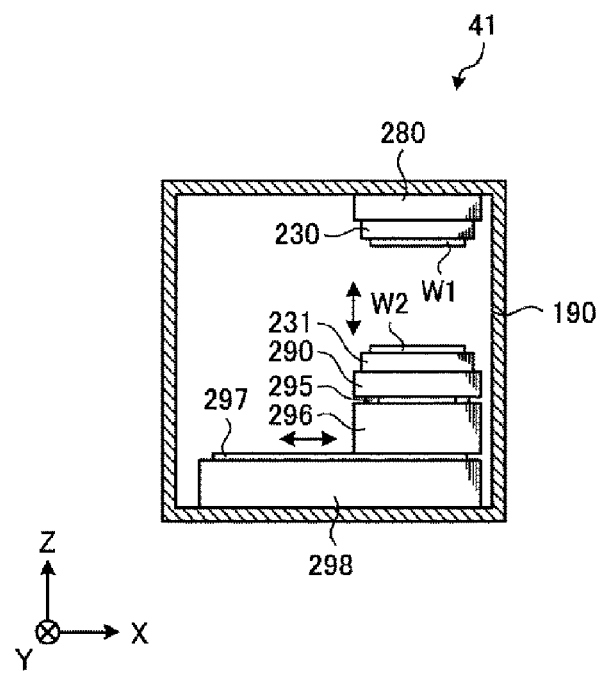
FIG. 9 is a schematic side view illustrating the configuration of the bonding apparatus.
Figure 10:
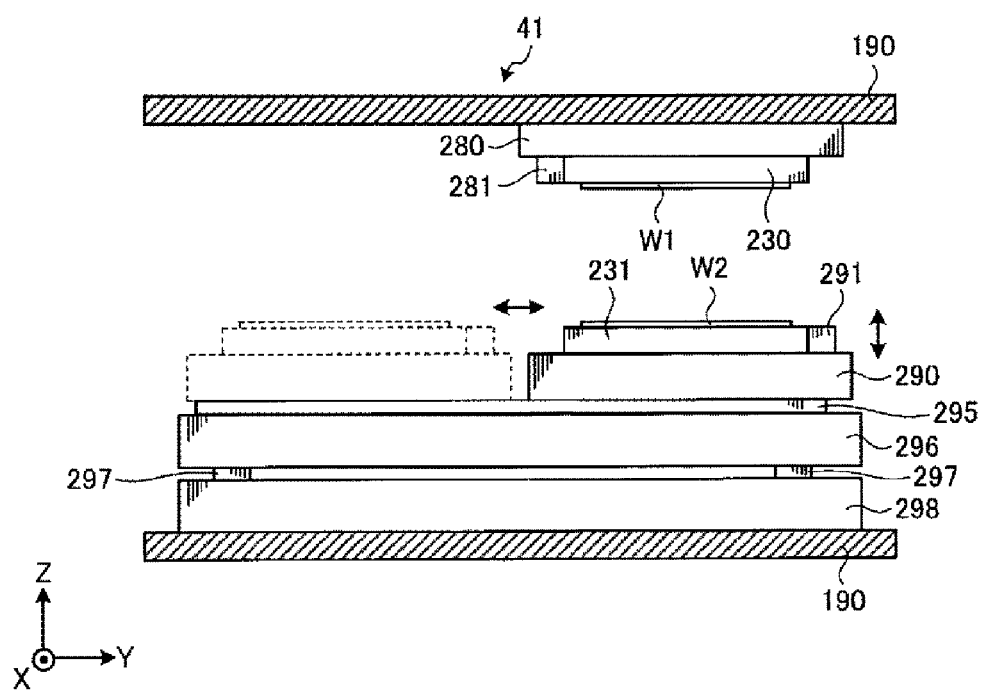
FIG. 10 is a schematic side view illustrating an internal configuration of the bonding apparatus.

Now, a configuration of the bonding apparatus 41 will be explained with reference to FIG. 8 to FIG. 13. FIG. 8 is a schematic plan view illustrating the configuration of the bonding apparatus 41, and FIG. 9 is a schematic side view thereof. Further, FIG. 10 is a schematic side view illustrating an internal configuration of the bonding apparatus 41.

As depicted in FIG. 8, the bonding apparatus 41 includes a processing vessel 190 which is hermetically sealed. A carry-in/out opening 191 for the upper wafer W1, the lower wafer W2 and the combined wafer T is formed in a lateral surface of the processing vessel 190 at the side of the transfer section 60. A shutter 192 for opening/closing the carry-in/out opening 191 is provided at the carry-in/out opening 191.

As shown in FIG. 9, an upper chuck 230 and a lower chuck 231 are provided within the processing vessel 190. The upper chuck 230 is configured to attract and hold the upper wafer W1 from above. Further, the lower chuck 231 is provided under the upper chuck 230 and is configured to attract and hold the lower wafer W2 from below. The upper chuck 230 is an example of an upper holding unit, and the lower chuck 231 is an example of a lower holding unit.

The upper chuck 230 is supported by a supporting member 280 provided at a ceiling surface of the processing vessel 190, as illustrated in FIG. 9.

The supporting member 280 is equipped with an upper imaging unit 281 (see FIG. 10) configured to image the bonding surface W2j of the lower wafer W2 held by the lower chuck 231. The upper imaging unit 281 is disposed adjacent to the upper chuck 230.

As shown in FIG. 8, FIG. 9 and FIG. 10, the lower chuck 231 is supported by a first lower chuck moving unit 290 which is provided under the corresponding lower chuck 231. The first lower chuck moving unit 290 is configured to move the lower chuck 231 in the horizontal direction (Y-axis direction), as will be described later. Further, the first lower chuck moving unit 290 is also configured to move the lower chuck 231 in the vertical direction and rotate the lower chuck 231 around the vertical axis.

The first lower chuck moving unit 290 is equipped with a lower imaging unit 291 configured to image the bonding surface W1j of the upper wafer W1 held by the upper chuck 230. The lower imaging unit 291 is disposed adjacent to the lower chuck 231.

As illustrated in FIG. 8, FIG. 9 and FIG. 10, the first lower chuck moving unit 290 is mounted to a pair of rails 295 which is provided at a bottom surface side of the first lower chuck moving unit 290 and extended in the horizontal direction (Y-axis direction). The first lower chuck moving unit 290 is configured to be moved along the rails 295.

The pair of rails 295 is provided on a second lower chuck moving unit 296. The second lower chuck moving unit 296 is mounted to a pair of rails 297 which is provided at a bottom surface side of the second lower chuck moving unit 296 and extended in the horizontal direction (X-axis direction). This second lower chuck moving unit 296 is configured to be moved along the rails 297, that is, to move the lower chuck 231 in the horizontal direction (X-axis direction). Further, the pair of rails 297 is provided on a placing table 298 provided on the bottom surface of the processing vessel 190.

Figure 11:
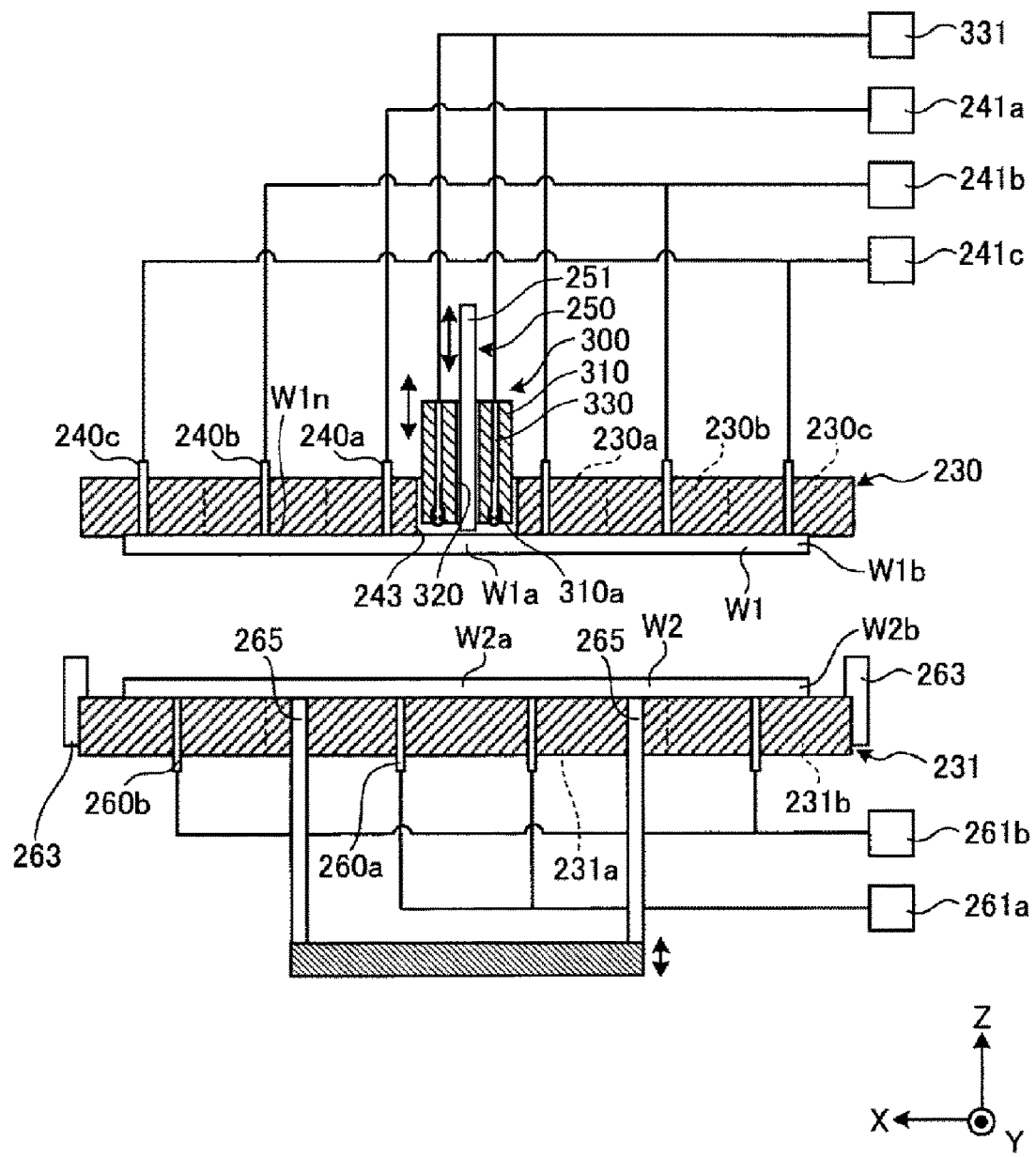
FIG. 11 is a schematic side view illustrating configurations of an upper chuck and a lower chuck.
Figure 12:
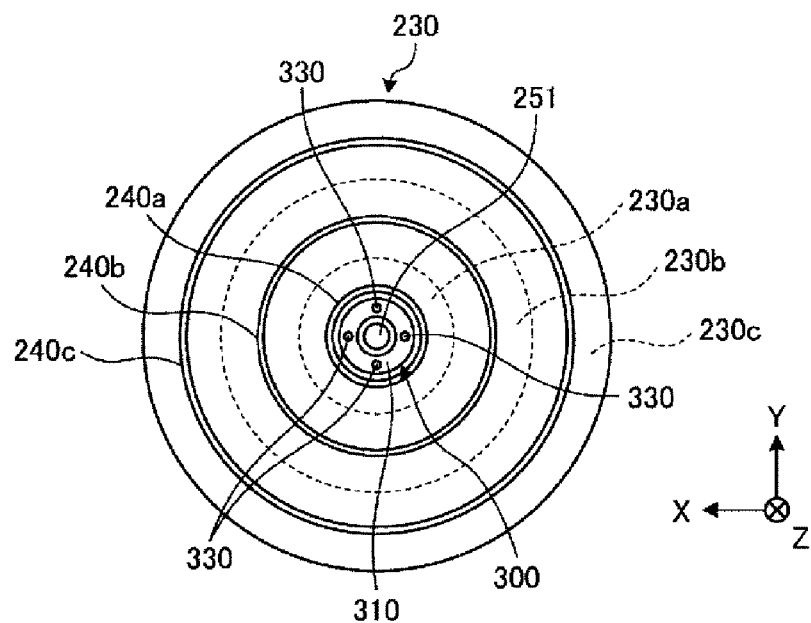
FIG. 12 is a schematic plan view of the upper chuck viewed from below.
Figure 13:
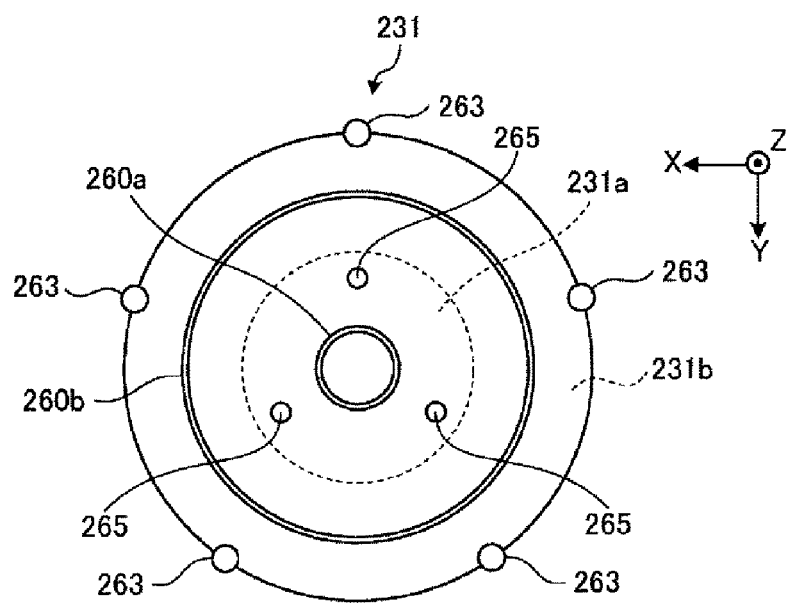
FIG. 13 is a schematic plan view of the lower chuck viewed from above.

Now, configurations of the upper chuck 230 and the lower chuck 231 will be explained with reference to FIG. 11 to FIG. 14. FIG. 11 is a schematic side view illustrating the configurations of the upper chuck 230 and the lower chuck 231. Further, FIG. 12 is a schematic plan view of the upper chuck 230 seen from below, and FIG. 13 is a schematic plan view of the lower chuck 231 seen from above.

As shown in FIG. 11, the upper chuck 230 is partitioned into plural, for example, three regions 230a, 230b and 230c. These regions 230a, 230b and 230c are arranged in this sequence from a central portion of the upper chuck 230 toward a periphery (outer periphery) thereof, as shown in FIG. 12. The region 230a has a circular shape when viewed from the top, and the regions 230b and 230c have annular shapes when viewed from the top.

The regions 230a, 230b and 230c are respectively provided with individual suction lines 240a, 240b and 240c for attracting and holding the upper wafer W1, as shown in FIG. 11. The suction lines 240a, 240b and 240c are respectively connected to vacuum pumps 241a, 241b and 241c. As stated, the upper chuck 230 is configured to set vacuum evacuation on the upper wafer W1 at each of the regions 230a, 230b and 230c individually.

Besides the suction lines 240a, 240b and 240c, the upper chuck 230 is also equipped with an attracting/holding unit 300 configured to hold the upper wafer W1 by attraction. To elaborate, the upper wafer W1 transferred by the transfer device 61 is first attracted by the attracting/holding unit 300, and then, is attracted by the suction lines 240a, 240b and 240c of the upper chuck 230.

To elaborate, a through hole 243 is formed through the central portion of the upper chuck 230 in a thickness direction thereof, and the attracting/holding unit 300 and the push member 250 are provided in this through hole 243.

Figure 14:
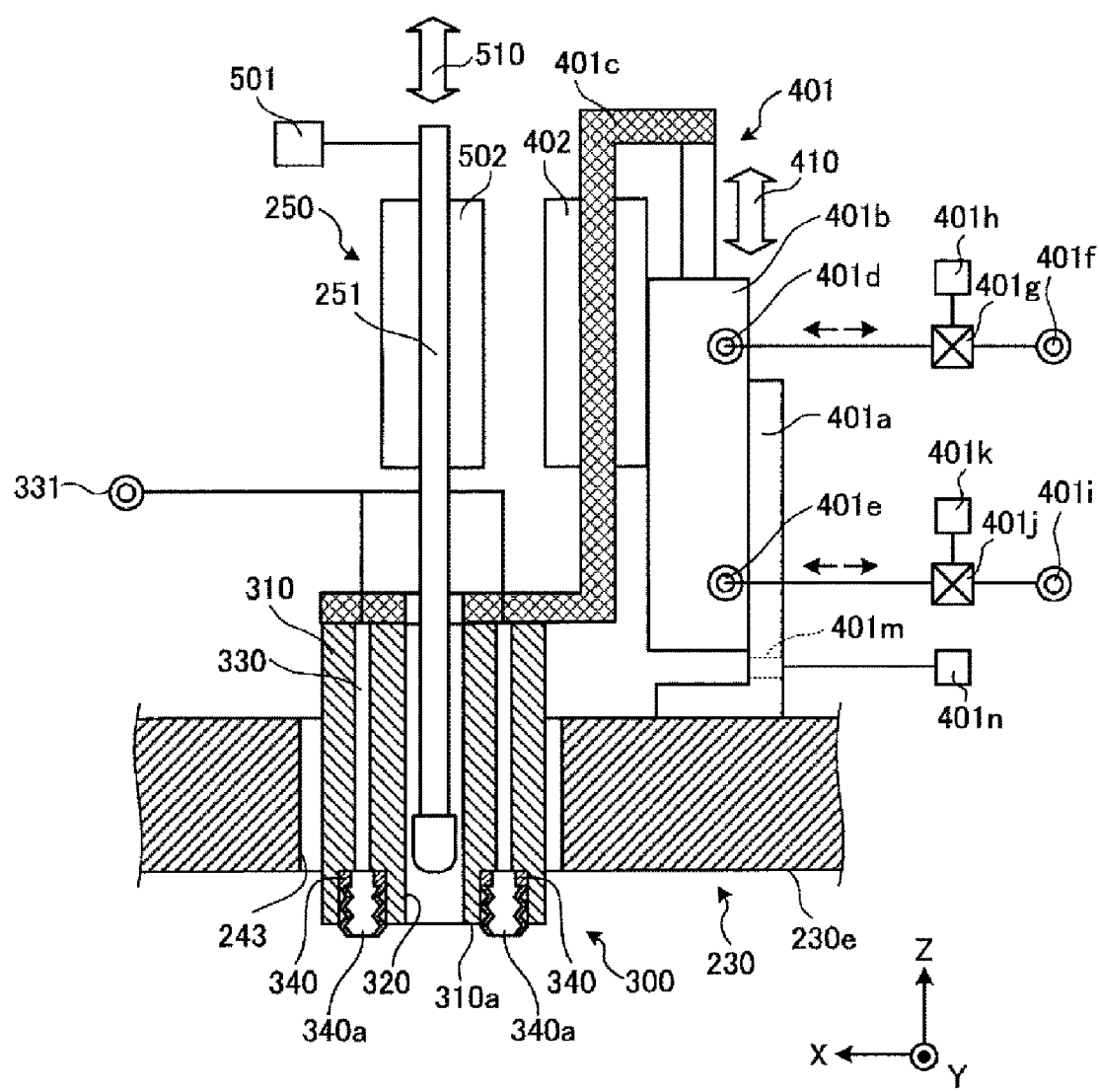
FIG. 14 is an enlarged schematic side view illustrating the vicinity of a push member and an attracting/holing unit.

FIG. 14 is an enlarged schematic side view illustrating the vicinity of the attracting/holding unit 300 and the push member 250 in the upper chuck 230. As depicted in FIG. 14, the attracting/holding unit 300 includes a base member 310, an insertion through hole 320, air suction paths 330, and attracting members 340. Further, the push member 250 includes a push pin 251. Here, the push pin 251 is an example of a pushing unit.

The base member 310 has, for example, a cylindrical shape, as shown in FIG. 12 and FIG. 14, and is inserted through the through hole 243 of the upper chuck 230. Further, the base member 310 includes, for example, a resin member, but not limited thereto.

FIG. 14 illustrates a state immediately before the attracting/holding unit 300 holds the upper wafer W1. As shown in this figure, before the upper wafer W1 is held, the base member 310 is located such that a bottom surface 310a thereof is lower than a bottom surface (holding surface) 230e of the upper chuck 230. Further, since the bottom surface 310a of the base member 310 also serves to hold the upper wafer W1 as will be described later, the bottom surface 310a will sometimes be referred to as "holding surface 310a" in the following description.

Further, the holding surface 310a of the base member 310 has a very small area as compared to the non-bonding surface W1n of the upper wafer W1, as can be seen from FIG. 11. Accordingly, the attracting/holding unit 300 holds a part of the top surface (non-bonding surface W1n) of the upper wafer W1 by attraction.

The insertion through hole 320 is formed through a central portion of the base member 310 in a lengthwise direction thereof. The push pin 251 is inserted through this insertion through hole 320. As stated, since the attracting/holding unit 300 has the insertion through hole 320 through which the push pin 251 is inserted, it is possible to provide the attracting/holding unit 300 and the push pine 251 together at the single place in the central portion of the upper chuck 230. Thus, space saving of the attracting/holding unit 300 or the like can be achieved.

The air suction paths 330 are holes formed along the lengthwise direction of the base member 310 and opened at the holding surface 310a of the base member 310. The air suction paths 330 are connected to a vacuum pump 331. As the vacuum pump 331 is operated, suction air for attracting the upper wafer W1 is flown in the air suction paths 330.

The multiple air suction paths 330 are formed around the push pin 251 at the outside thereof, as shown in FIG. 12. In the shown example, four air suction paths 330 are formed around the push pin 251 at an angular interval of 90 degrees. By way of another example, however, the upper wafer W1 can be still stably attracted with three air suction paths 330 arranged at an angular interval of 120 degrees. Further, the number of the air suction paths 330 is not limited to the shown examples.

The attracting members 340 are provided in the air suction paths 330, respectively. To elaborate, within each air suction path 330, the attracting member 340 is provided in the vicinity of the opening on the holding surface 310a of the base member 310 at an upstream side of a flow direction of the suction air which attracts the upper wafer W1.

Each attracting member 340 is located such that an end portion 340a thereof is protruded from the holding surface 310a of the base member 310 before the attracting member comes into contact with the upper wafer W1. The attracting member 340 includes an elastic member, and specifically, may be implemented by, by way of example, but not limitation, a rubber pad having a bellows shape. Further, the attracting member 340 may be formed in, for example, a cylindrical shape, and comes into contact with and attracts the upper wafer W1 before held by the upper chuck 230.

The attracting/holding unit 300 having the above-described configuration is configured to be movable up and down with respect to the upper chuck 230. To be specific, the attracting/holding unit 300 is connected to a first linearly moving mechanism 401 and is configured to be linearly movable along the Z-axis direction. The first linearly moving mechanism 401 may be, but not limited to, an air cylinder of double-acting type.

The first linearly moving mechanism 401 includes a base part 401a, a fixed part 401b, a movable part 401c, a first air inlet/outlet part 401d and a second air inlet/outlet part 401e. The base part 401a is fastened to the upper chuck 230. The fixed part 401b is provided at the base part 401a.

The movable part 401c is configured to be linearly movable along the Z-axis direction with respect to the fixed part 401b. The movable part 401c is driven by the first and second air inlet/outlet parts 401d and 401e.

To elaborate, the first linearly moving mechanism 401 moves the movable part 401c linearly along the Z-axis direction (see an arrow 410 in the figure) by a pressure difference between an air supplied from and exhausted through the first air inlet/outlet part 401d via a vacuum pump 401f and a valve 401g and an air supplied from and exhausted through the second air inlet/outlet part 401e via a vacuum pump 401i and a valve 401j.

Further, a linear motion guide 402 is mounted to the movable part 401c. Accordingly, the movable part 401c is driven by being guided through the linear motion guide 402 in the Z-axis direction. Further, the base member 310 of the attracting/holding unit 300 is mounted to the movable part 401c. Thus, the attracting/holding unit 300 is also linearly movable along the Z-axis direction, that is, movable up and down with respect to the upper chuck 230.

Further, the first linearly moving mechanism 401 is connected to the first air inlet/outlet part 401d and the second air inlet/outlet part 401e, and includes velocity control valves 401h and 401k configured to vary a flow rate of discharged air. By varying the flow rate of the discharged air through these velocity control valves 401h and 401k, the first linearly moving mechanism 401 controls a speed of the attracting/holding unit 300.

Further, as shown in FIG. 14, the base part 401a is provided with an exhaust port 401m under a movable region of the first linearly moving mechanism 401. This exhaust port 401m is connected to, for example, a suction device 401n, and is capable of suctioning and exhausting particles generated in the movable region as the movable part 401c is operated.

Further, though not shown in detail, the second linearly moving mechanism 501 having the same configuration as the first linearly moving mechanism 401 is connected to the push pin 251, and the push pin 251 is also configured to be linearly movable along the Z-axis direction (see an arrow 510 in the figure). Further, the push pin 251 is equipped with a linear motion guide 502, and the push pin 251 is driven by being guided in the Z-axis direction through the linear motion guide 502.

As stated above, since the attracting/holding unit 300 is connected to the first linearly moving mechanism 401 and the push pin 251 is connected to the second linearly moving mechanism 501, the attracting/holding unit 300 and the push pin 251 can be driven independently.

As depicted in FIG. 11, the insertion through hole 320 of the attracting/holding unit 300 corresponds to the central portion W1a of the upper wafer W1 attracted to and held by the upper chuck 230. Accordingly, if the push pin 251 inserted through the insertion through hole 320 is moved downwards by the second linearly moving mechanism 501, the push pin 251 is capable of bringing the central portion W1a of the upper wafer W1 and the central portion W2a of the lower wafer W2 into contact with each other and pressing them when the upper wafer W1 and the lower wafer W2 are bonded.

The lower chuck 231 is partitioned into a plurality of, for example, two regions 231a and 231b, as shown in FIG. 13. These regions 231a and 231b are provided in this sequence from a central portion of the lower chuck 231 toward a periphery thereof. The region 231a has a circular shape when viewed from the top, and the region 231b has an annular shape when viewed from the top.

The regions 231a and 231b are respectively provided with individual suction lines 260a and 260b for attracting and holding the lower wafer W2, as depicted in FIG. 11. The suction lines 260a and 260b are respectively connected to vacuum pumps 261a and 261b. With this configuration, the lower chuck 231 is configured to set vacuum evacuation on the lower wafer W2 at each of the regions 231a and 231b.

Further, the lower chuck 231 is equipped with a multiple number of holding pins 265 configured to be movable up and down in the vertical direction. For example, in the lower chuck 231, the holding pins 265 protruded from a holding surface of the lower chuck 231 receive and place thereon the lower wafer W2, and, then, the holding pins 265 are lowered to bring the lower wafer W2 into contact with the holding surface. In the lower chuck 231, as the vacuum pumps 261a and 261b are operated, the lower wafer W2 is attracted and held in the individual regions 231a and 231b, as shown in FIG. 11. Further, in the above description, the holding pins 265 hold the lower wafer W2 by placing the lower wafer W2 thereon. However, the exemplary embodiment is not limited thereto, and the holding pins 265 may be configured to hold the lower wafer W2 by attraction.

Further, stopper members 263 configured to suppress the upper wafer W1, the lower wafer W2 and the combined wafer T from being protruded from the lower chuck 231 or sliding off the lower chuck 231 are provided at plural positions, for example, five positions at a periphery portion of the lower chuck 231.

Here, an operation in which the transfer device 61 transfers the upper wafer W1 to the upper chuck 230 having the above-described configuration will be explained with reference to FIG. 15A to FIG. 15F. FIG. 15A to FIG. 15F are diagrams for describing a transfer operation of the upper wafer W1 in the bonding apparatus 41. In FIG. 15A to FIG. 15F, parts irrelevant to the description may be omitted. Further, the attracting/holding unit 300 and the transfer device 61 are controlled by the controller of the control device 100.

Figure 15A:
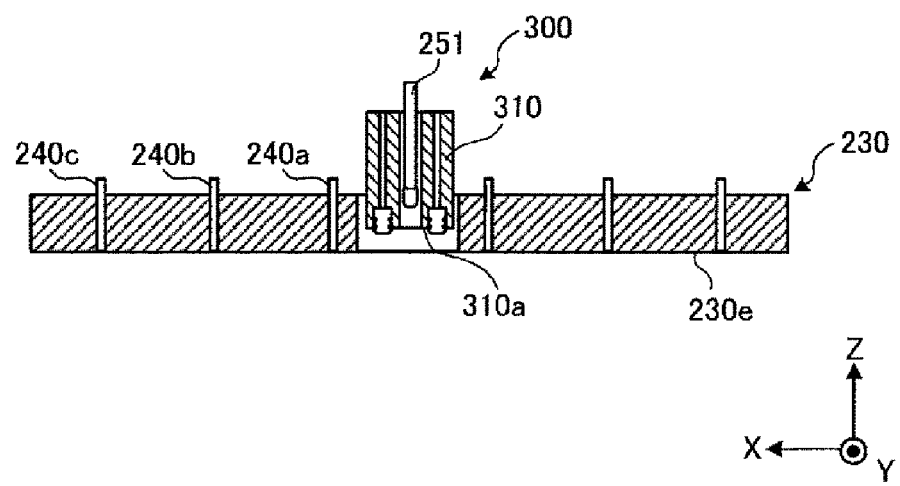
FIG. 15A is a diagram for describing a transfer operation of an upper wafer in the bonding apparatus.

FIG. 15A illustrates a state before the upper wafer W1 is transferred by the transfer device 61. As shown in FIG. 15A, the attracting/holding unit 300 is placed such that the holding surface 310a of the base member 310 is higher than the bottom surface 230e of the upper chuck 230. This position of the attracting/holding unit 300 may sometimes be referred to as "retreat position."

Figure 15B:
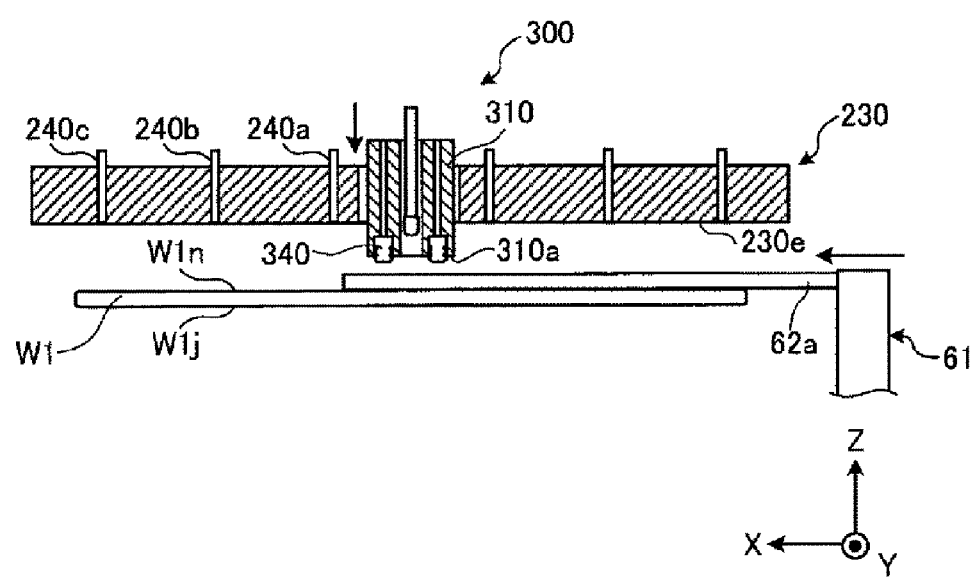
FIG. 15B is a diagram for describing the transfer operation of the upper wafer in the bonding apparatus.

As depicted in FIG. 15B, the upper wafer W1 with the bonding surface W1j thereof facing downwards and the non-bonding surface W1n thereof facing upwards is transferred while the non-bonding surface W1n thereof is attracted to and held by the first holding unit 62a of the transfer device 61.

When the upper wafer W1 is transferred, the attracting/holding unit 300 is lowered and is located such that the holding surface 310a of the base member 310 is lower than the bottom surface 230e of the upper chuck 230. Hereinafter, this position of the attracting/holding unit 300 may sometimes be referred to as "advance position."

Figure 15C:
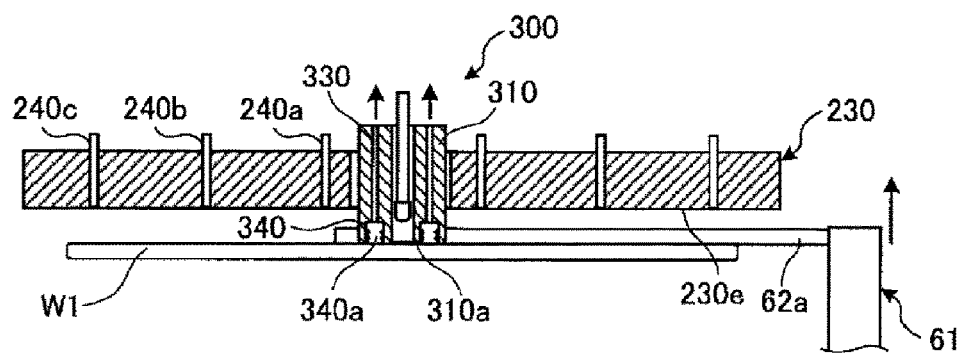
FIG. 15C is a diagram for describing the transfer operation of the upper wafer in the bonding apparatus.
Figure 15C:
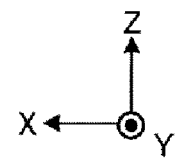

Subsequently, as depicted in FIG. 15C, in the attracting/holding unit 300, air suctioning in the air suction paths 330 and the attracting members 340 is begun by operating the vacuum pump 331 (see FIG. 11), and the upper wafer W1 is raised by the first holding unit 62a.

As stated above, since the end portions 340a of the attracting members 340 are protruded from the holding surface 310a of the base member 310 in the state before the attracting members 340 come into contact with the upper wafer W1, the attracting members 340 are firstly come into contact with the upper wafer W1. Accordingly, the attracting/holding unit 300 is capable of starting the attraction of the upper wafer W1 securely with the attracting members 340.

Figure 16:
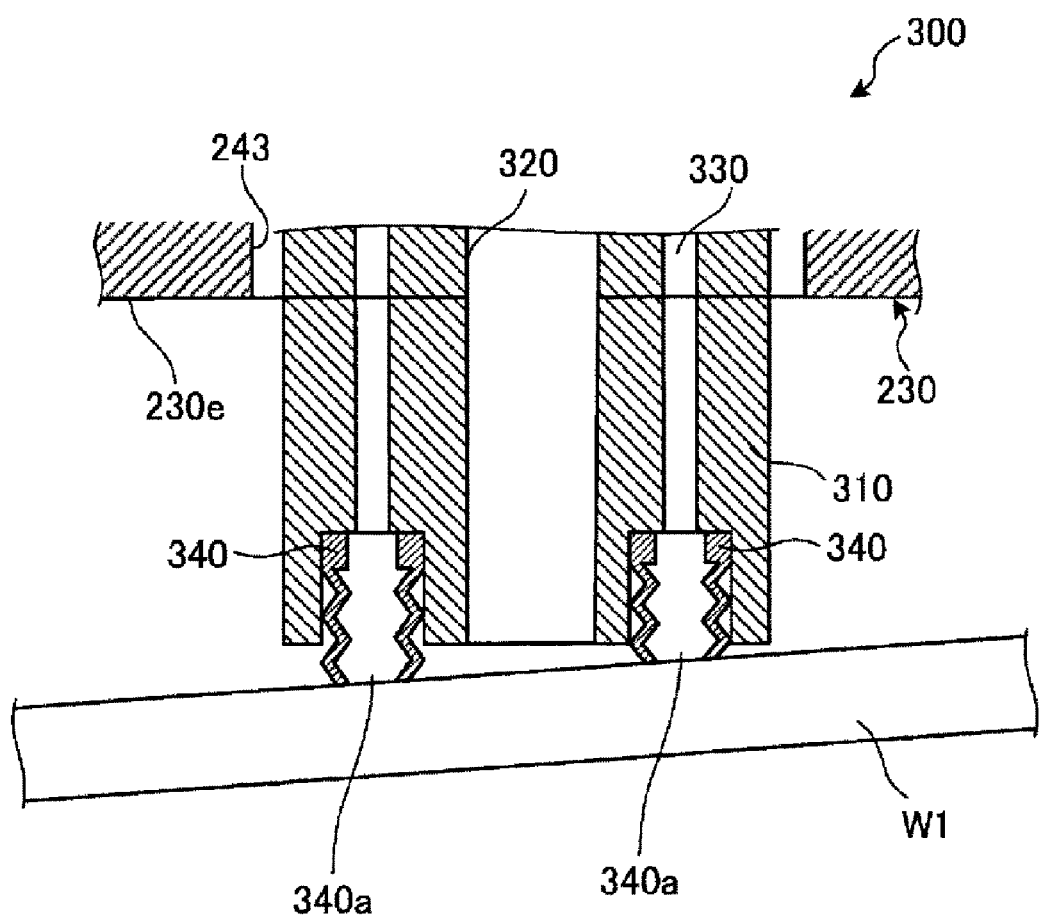
FIG. 16 is a schematic enlarged view illustrating a state in which the upper wafer is being transferred to an attracting member.

Further, since the attracting members 340 include the elastic members as stated above, an influence from an inclination of the upper wafer W1 can be absorbed. FIG. 16 is an enlarged schematic diagram illustrating a state when the upper wafer W1 transferred inclined with respect to the horizontal direction is transferred to the attracting members 340. In FIG. 16, the inclination of the upper wafer W1 is exaggerated for the convenience of illustration.

As depicted in FIG. 16, if the inclined upper wafer W1 comes into contact with the attracting members 340, the attracting members 340 are elastically transformed to correspond to a shape of the inclined upper wafer W1. In the example shown in FIG. 16, in case that the upper wafer W1 is inclined downwards to the left on the paper of the drawing, as the attracting members 340 at the left-hand side of the drawing are extended while the attracting members 340 at the right-hand side are contracted, the end portions 340a can be allowed to come into contact with the upper wafer W1 and attract the upper wafer W1. As stated, since the attracting members 340 are elastic members, they can absorb the influence from the inclination of the upper wafer W1 by being elastically transformed.

Figure 15D:
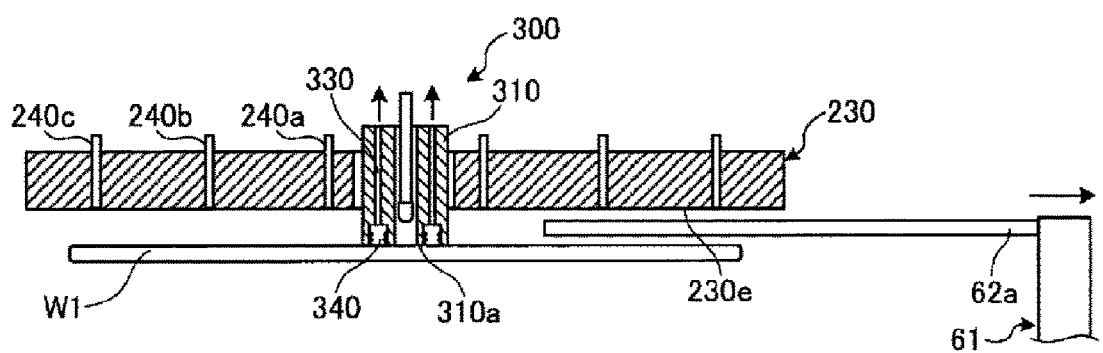
FIG. 15D is a diagram for describing the transfer operation of the upper wafer in the bonding apparatus.
Figure 15D:
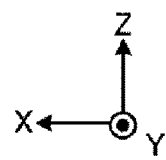

Thereafter, as shown in FIG. 15D, if the upper wafer W1 is attracted by the air suction paths 330 and the attracting members 340 and held by the holding surface 310a of the base member 310, the first holding unit 62a releases the attraction of the upper wafer W1 and is retreated out of the bonding apparatus 41.

Figure 15E:
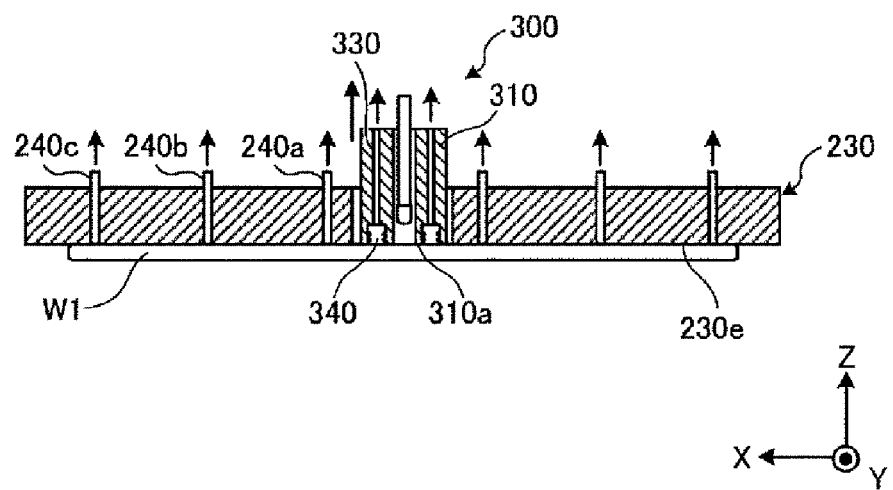
FIG. 15E is a diagram for describing the transfer operation of the upper wafer in the bonding apparatus.

Afterwards, as depicted in FIG. 15E, in the upper chuck 230, by operating the vacuum pumps 241a, 241b and 241c (see FIG. 11), the air suctioning in the respective suction lines 240a, 240b and 240c is begun. Further, the attracting/holding unit 300 placed at the advance position is raised back to be located such that the holding surface 310a of the base member 310 is level with or slightly above the bottom surface 230e of the upper chuck 230. Hereinafter, this position of the attracting/holding unit 300 may sometimes be referred to as "transfer position."

Further, at the transfer position of the attracting/holding unit 300, even if the holding surface 310a of the base member 310 is located slightly above the bottom surface 230e of the upper chuck 230, the attraction of the upper wafer W1 can be continued as the attracting members 340 are elastically extended.

For example, the attracting force at the transfer position of the attracting/holding unit 300 may be set to be equal to or smaller than an attracting force of the upper chuck 230. Accordingly, deformation of the upper wafer W1 can be suppressed.

That is, for example, if the attracting force of the attracting/holding unit 300, which is located at the transfer position, is larger than the attracting force of the upper chuck 230, the central portion of the upper wafer W1 may be stretched upwards and thus deformed. If, however, the attracting force of the attracting/holding unit 300 is set to be no larger than the attracting force of the upper chuck 230, such a deformation of the upper wafer W1 can be suppressed.

Figure 15F:
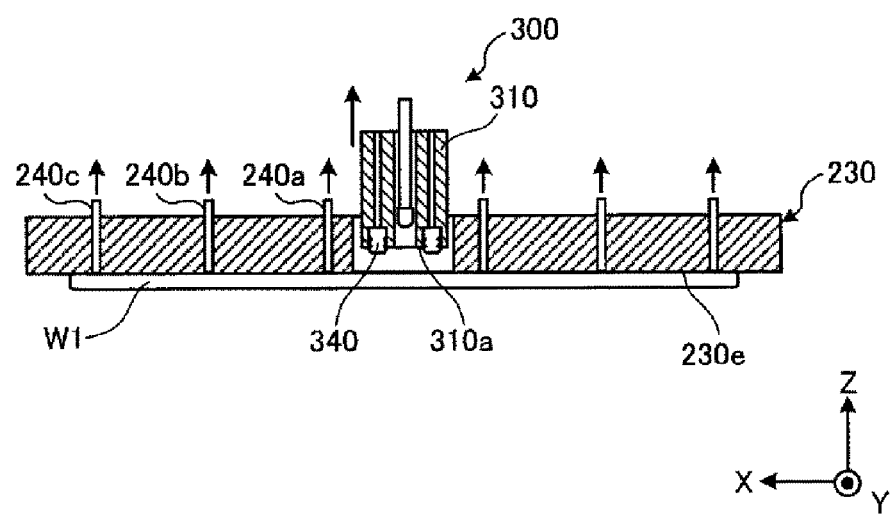
FIG. 15F is a diagram for describing the transfer operation of the upper wafer in the bonding apparatus.

Subsequently, as shown in FIG. 15F, the upper wafer W1 is delivered from the attracting/holding unit 300 to the upper chuck 230. If the upper chuck 230 holds the upper wafer W1 by attracting the entire non-bonding surface W1n of the upper wafer W1, the vacuum pump 331 is stopped, and, thus, the attracting/holding unit 300 is raised up to the retreat position. In this way, the transfer operation of the upper wafer W1 in the bonding apparatus 41 is completed.

As discussed above, in the present exemplary embodiment, since the attracting/holding unit 300 holds the upper wafer W1 by attracting a part (e.g., vicinity of central portion) of the top surface (non-bonding surface W1n) of the upper wafer W1, the first holding unit 62a is capable of transferring the upper wafer W1 while attracting and holding the rest part of the upper wafer W1 other than the part held by the attracting/holding unit 300.

Therefore, in the bonding apparatus 41, since the bonding surface W1j of the upper wafer W1 is not held by the first holding unit 62a of the transfer device 61, the particle generation can be suppressed.

3. Bonding Operation and Position Adjustment of Wafer in Bonding Apparatus

Now, position adjustment of the upper wafer W1 and the lower wafer W2 and bonding operation of the upper wafer W1 and the lower wafer W2 in the bonding apparatus 41, into which the upper wafer W1 has been transferred as stated above, will be elaborated. FIG. 17A to FIG. 17H are diagrams for describing the operation of the bonding apparatus 41. Further, in FIG. 17A to FIG. 17H, illustration of the attracting/holding unit 300 is omitted for the simplicity of illustration.

Here, it is assumed that the modification processing and the hydrophilized processing are performed on each of the bonding surface W1j of the upper wafer W1 and the bonding surface W2j of the lower wafer W2 shown in FIG. 17A to FIG. 17H. Further, the non-bonding surface W1n of the upper wafer W1 is attracted to and held by the upper chuck 230, and the non-bonding surface W2n of the lower wafer W2 is attracted to and held by the lower chuck 231.

Then, positions of the upper wafer W1 held by the upper chuck 230 and the lower wafer W2 held by the lower chuck 231 are adjusted in the horizontal direction.

Figure 17A:
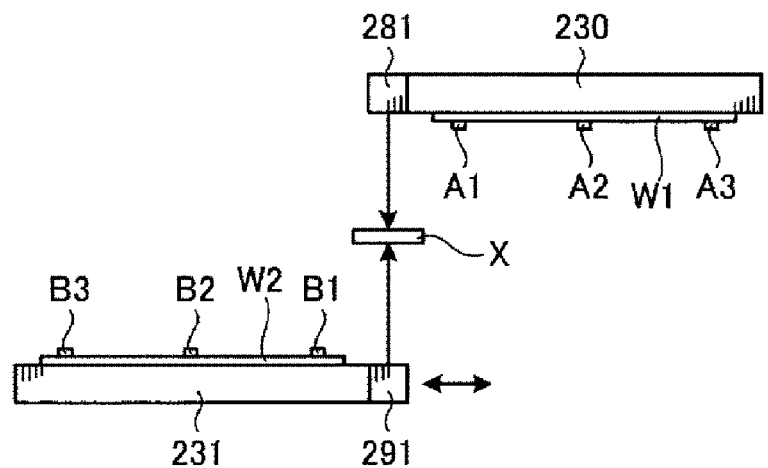
FIG. 17A is a diagram for describing an operation of the bonding apparatus.

As shown in FIG. 17A, a multiple number of, e.g., three preset reference points A1 to A3 are set on the bonding surface W1j of the upper wafer W1. Likewise, a multiple number of, e.g., three preset reference points B1 to B3 are set on the bonding surface W2j of the lower wafer W2. For example, preset patterns formed on the upper wafer W1 and the lower wafer W2 are used as these reference points A1 to A3 and B1 to B3. The number of the reference points can be set as required.

First, as illustrated in FIG. 17A, positions of the upper imaging unit 281 and the lower imaging unit 291 in the horizontal direction are adjusted. To elaborate, the lower chuck 231 is moved in the horizontal direction by the first lower chuck moving unit 290 and the second lower chuck moving unit 296 such that the lower imaging unit 291 is located roughly under the upper imaging unit 281. Then, a common target X is checked in the upper imaging unit 281 and the lower imaging unit 291, and the position of the lower imaging unit 291 in the horizontal direction is precisely adjusted such that the positions of the upper imaging unit 281 and the lower imaging unit 291 in the horizontal direction are coincident.

Figure 17B:
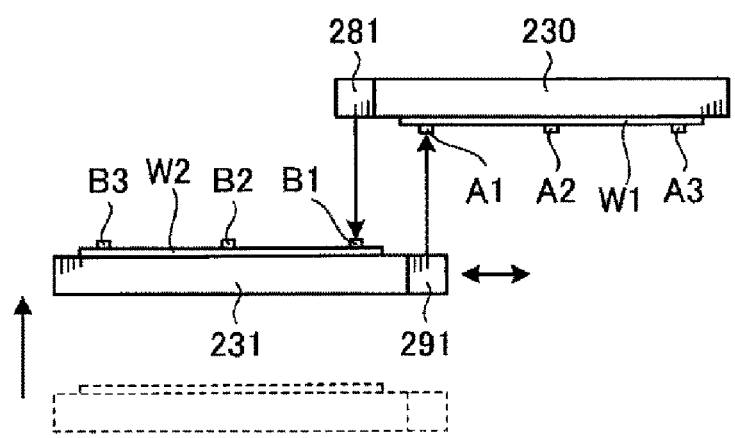
FIG. 17B is a diagram for describing the operation of the bonding apparatus.

Thereafter, as depicted in FIG. 17B, after the lower chuck 231 is moved vertically upwards by the first lower chuck moving unit 290, the positions of the upper chuck 230 and the lower chuck 231 in the horizontal direction are adjusted.

To be specific, while moving the lower chuck 231 in the horizontal direction by the first lower chuck moving unit 290 and the second lower chuck moving unit 296, the reference points B1 to B3 of the bonding surface W2j of the lower wafer W2 are imaged in sequence by using the upper imaging unit 281. At the same time, while the lower chuck 231 is being moved in the horizontal direction, the reference points A1 to A3 of the bonding surface W1j of the upper wafer W1 are also imaged in sequence by using the lower imaging unit 291. FIG. 17B illustrates a state where the reference point B1 of the lower wafer W2 is imaged by the upper imaging unit 281 and the reference point A1 of the upper wafer W1 is imaged by the lower imaging unit 291.

The obtained image data are output to the control device 100. The control device 100 controls the first and second lower chuck moving units 290 and 296 to adjust the position of the lower chuck 231 in the horizontal direction such that the reference points A1 to A3 of the upper wafer W1 and the reference points B1 to B3 of the lower wafer W2 are respectively coincident based on the image data obtained by the upper imaging unit 281 and the image data obtained by the lower imaging unit 291. In this way, as the positions of the upper chuck 230 and the lower chuck 231 in the horizontal direction are adjusted, the positions of the upper wafer W1 and the lower wafer W2 in the horizontal direction are also adjusted.

Figure 17C:
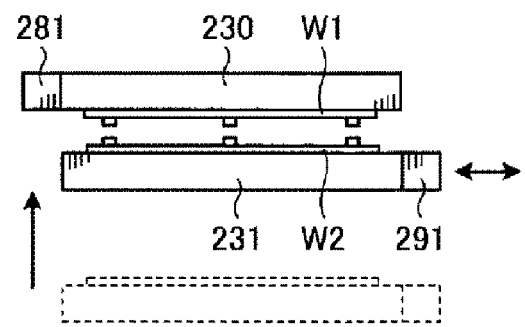
FIG. 17C is a diagram for describing the operation of the bonding apparatus.

Subsequently, as shown in FIG. 17C, by moving the lower chuck 231 vertically upwards by the first lower chuck moving unit 290, positions of the upper chuck 230 and the lower chuck 231 in the vertical direction are adjusted, so that the positions of the upper wafer W1 held by the upper chuck 230 and the lower wafer W2 held by the lower chuck 231 are adjusted in the vertical direction. At this time, a distance between the bonding surface W2j of the lower wafer W2 and the bonding surface W1j of the upper wafer W1 is set to a preset value, e.g., 80 μm to 200 μm.

With the above-described configuration, the position adjustment of the upper wafer W1 and the lower wafer W2 in the horizontal direction and in the vertical direction can be performed with high precision.

Figure 17D:
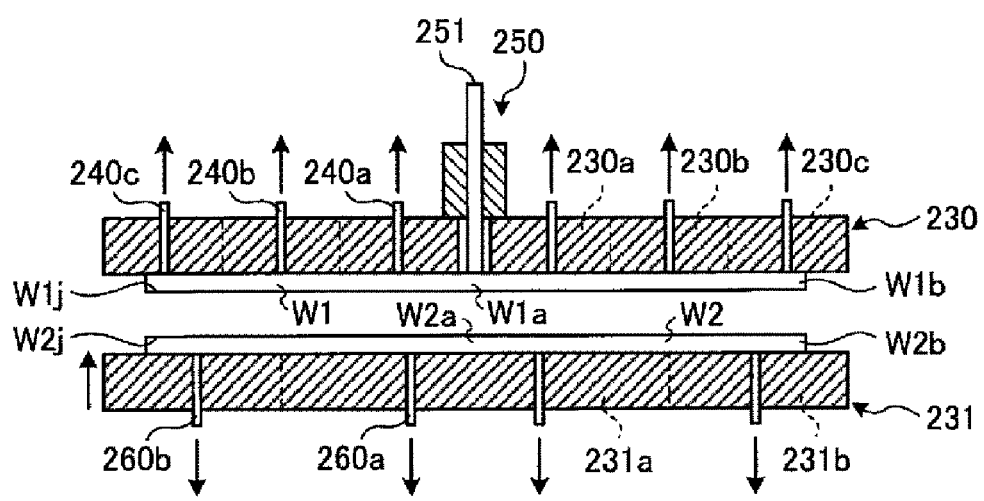
FIG. 17D is a diagram for describing the operation of the bonding apparatus.

FIG. 17D illustrates the upper chuck 230, the upper wafer W1, the lower chuck 231 and the lower wafer W2 after the above-described position adjustment in the horizontal direction and in the vertical direction is completed. As shown in FIG. 17D, the upper wafer W1 is held by being vacuum-evacuated in all of the regions 230a, 230b and 230c of the upper chuck 230, and the lower wafer W2 is held by being vacuum-evacuated in all of the regions 231a and 231b of the lower chuck 231.

Figure 17E:
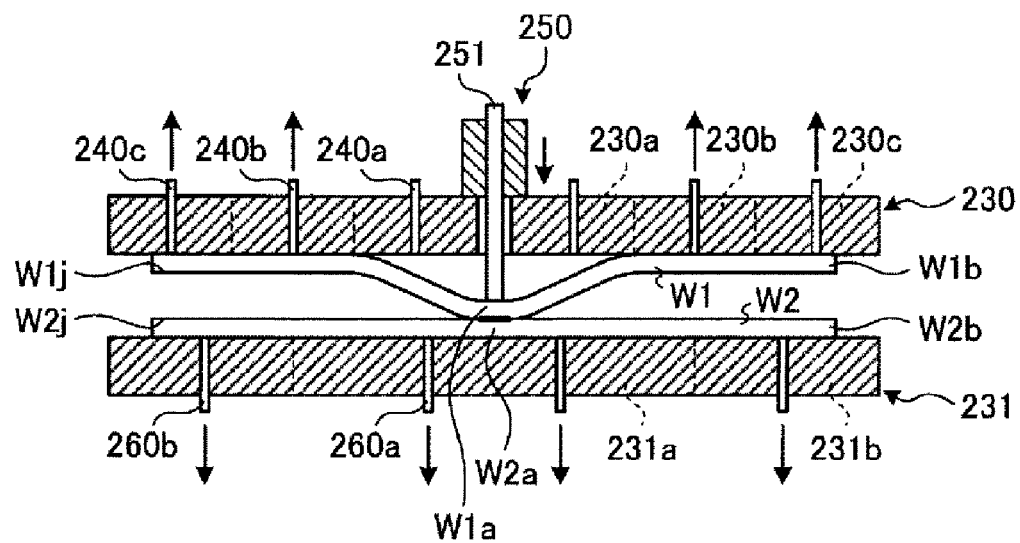
FIG. 17E is a diagram for describing the operation of the bonding apparatus.

Subsequently, the bonding processing in which the upper wafer W1 and the lower wafer W2 are bonded by the intermolecular force is performed. To elaborate, in the bonding processing, by stopping the vacuum pump 241a, the vacuum evacuation on the upper wafer W1 from the suction line 240a in the region 230a is stopped, as shown in FIG. 17E. At this time, the vacuum evacuation on the upper wafer W1 in the regions 230b and 230c is continued and the upper wafer W1 is still attracted and held. Thereafter, by lowering the push pin 251 of the push member 250, the upper wafer W1 is lowered while the central portion W1a thereof is pressed by the push pin 251. At this time, a load of, e.g., 200 g is applied to the push pin 251 such that the push pin 251 is moved by 70 μm in the state that the upper wafer W1 does not exist. Then, the central portion W1a of the upper wafer W1 and the central portion W2a of the lower wafer W2 are pressed in contact with each other by the push member 250.

Accordingly, the bonding is started between the central portion W1a of the upper wafer W1 and the central portion W2a of the lower wafer W2 which are pressed against each other (indicated by a bold line in FIG. 17E). That is, since the bonding surface W1j of the upper wafer W1 and the bonding surface W2j of the lower wafer W2 have been modified, Van der Waals force (intermolecular force) is generated between the bonding surfaces W1j and W2j, so that the bonding surfaces W1j and W2j are bonded. Further, since the bonding surface W1j of the upper wafer W1 and the bonding surface W2j of the lower wafer W2 have been hydrophilized, hydrophilic groups between the bonding surfaces W1j and W2j are hydrogen-bonded, so that the bonding surfaces W1j and W2j are firmly bonded.

Figure 17F:
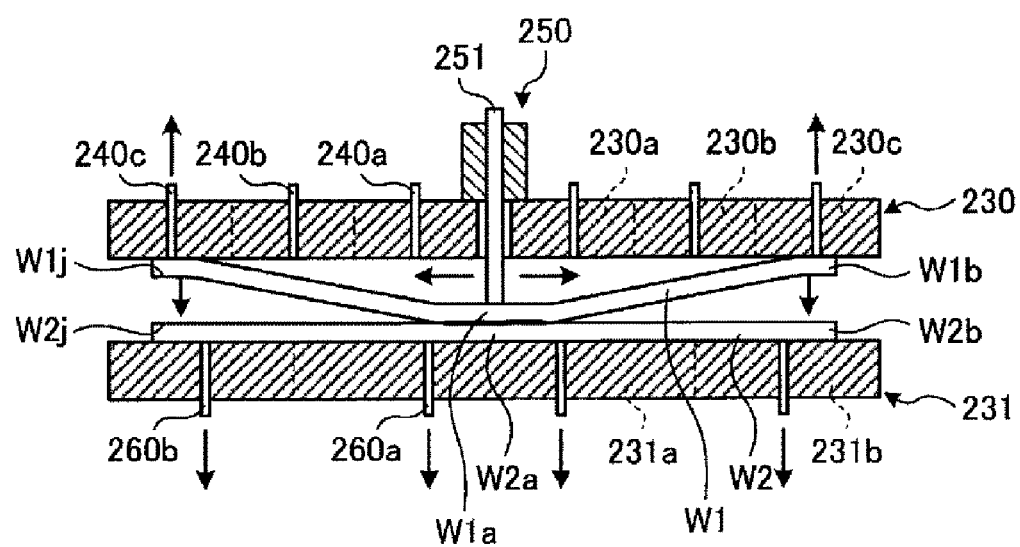
FIG. 17F is a diagram for describing the operation of the bonding apparatus.

Thereafter, as shown in FIG. 17F, in the state that the central portion W1a of the upper wafer W1 and the central portion W2a of the lower wafer W2 are pressed by the push member 250, by stopping the operation of the vacuum pump 241b, the vacuum evacuation on the upper wafer W1 from the suction line 240b in the region 230b is stopped.

Accordingly, the upper wafer W1 held in the region 230b falls on the lower wafer W2. Then, by stopping the operation of the vacuum pump 241c, the vacuum evacuation on the upper wafer W1 from the suction line 240c in the region 230c is stopped. In this way, by stopping the vacuum evacuation on the upper wafer W1 from the central portion W1a of the upper wafer W1 toward the periphery W1b thereof stage by stage, the upper wafer W1 falls down to be into contact with the lower wafer W2 stage by stage. The aforementioned bonding between the bonding surfaces W1j and W2j by the Van der Waals force and the hydrogen bonds gradually progresses from the central portion W1a toward the periphery W1b.

Figure 17G:
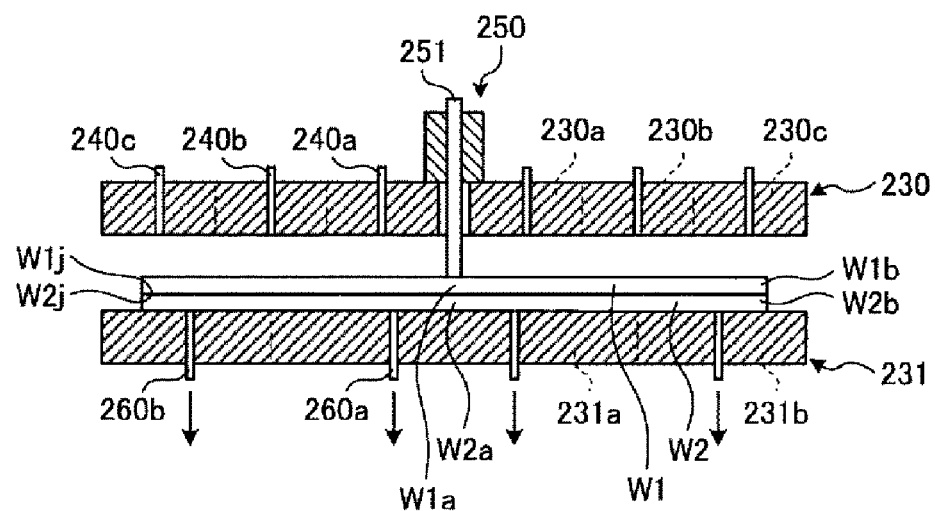
FIG. 17G is a diagram for describing the operation of the bonding apparatus.

Through these operations, the entire bonding surface W1j of the upper wafer W1 and the entire bonding surface W2j of the lower wafer W2 are brought into contact with each other, so that the upper wafer W1 and the lower wafer W2 are bonded, as illustrated in FIG. 17G.

Figure 17H:
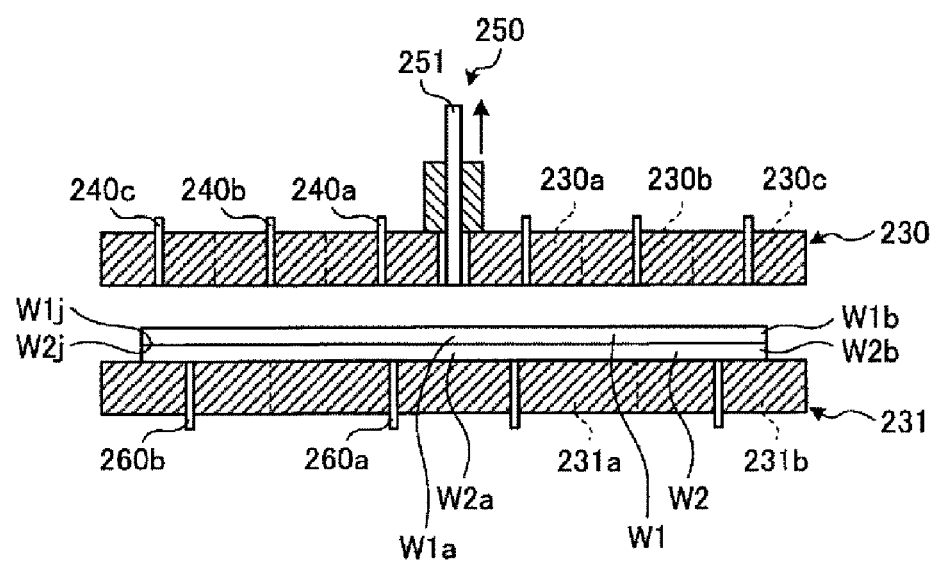
FIG. 17H is a diagram for describing the operation of the bonding apparatus.

Thereafter, as shown in FIG. 17H, the push member 250 is raised up to the upper chuck 230. Further, by stopping vacuum evacuation on the lower wafer W2 from the suction lines 260a and 260b in the lower chuck 231, the attraction and holding of the lower wafer W2 by the lower chuck 231 is released. Then, the bonding processing in the bonding apparatus 41 is ended.

4. Specific Operation of Bonding System

Figure 18:
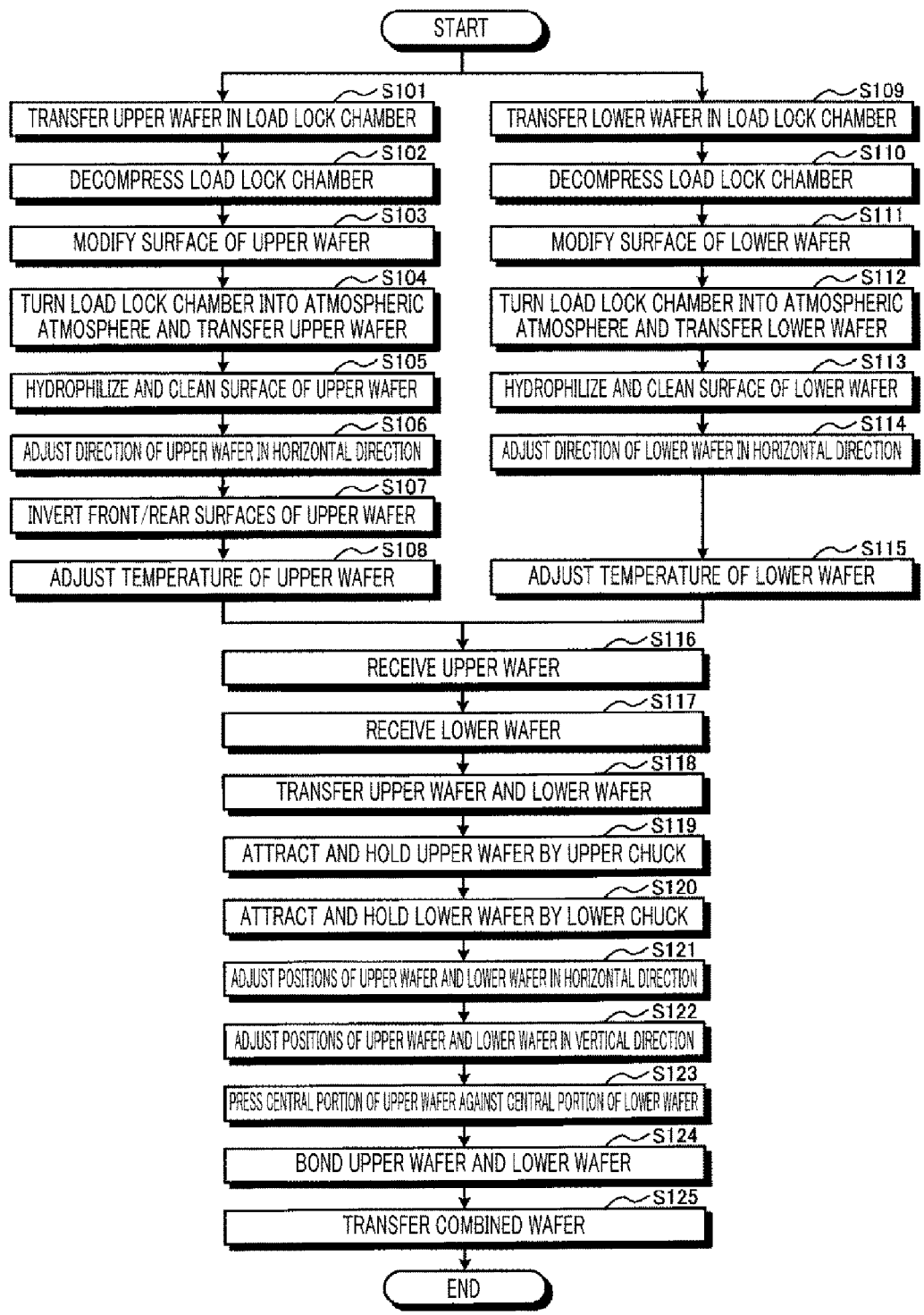
FIG. 18 is a flowchart for describing a part of a processing sequence performed by the bonding system.

Now, a specific operation of the bonding system 1 configured as described above will be explained with reference to FIG. 18. FIG. 18 is a flowchart for describing a part of a processing sequence performed by the bonding system 1. Various processings shown in FIG. 18 are performed under the control of the control device 100.

First, a cassette C1 accommodating a plurality of upper wafers W1, a cassette C2 accommodating a plurality of lower wafers W2 and an empty cassette C3 are placed on a preset placing plate 11 of the carry-in/out station 2. Then, an upper wafer W1 is taken out of the cassette C1 by the transfer device 22 and is transferred to the transition 53 of the third processing block G3 of the processing station 3.

Subsequently, the upper wafer W1 is transferred into the load lock chamber 31 of the first processing block G1 by the transfer device 61 and placed on the transition 31a1 (process S101). Then, after the gate valve 36a is closed, the load lock chamber 31 is decompressed into a decompressed atmosphere as the vacuum pump 31c is operated (process S102).

Afterwards, the upper wafer W1 is transferred into the surface modifying apparatus 33 from the load lock chamber 31 by the modification transfer device 32a of the transfer chamber 32. In the surface modifying apparatus 33, an oxygen gas as a processing gas is excited into plasma and ionized under the decompressed atmosphere. The oxygen ions are irradiated to a bonding surface W1j of the upper wafer W1, and the bonding surface W1j is plasma-processed. As a result, the bonding surface W1j of the upper wafer W1 is modified (process S103).

Thereafter, the upper wafer W1 is transferred into the load lock chamber 31 from the surface modifying apparatus 33 by the modification transfer device 32a and is placed on the transition 31a2. Then, as the gate valve 36a is opened, the load lock chamber 31 is turned into an atmospheric atmosphere from the decompressed atmosphere, and the transfer of the upper wafer W1 is performed (process S104). Though the load lock chamber 31 is turned into the atmospheric atmosphere, the transfer chamber 32 and the surface modifying apparatus 33 are kept in the decompressed atmosphere.

Subsequently, the upper wafer W1 is transferred into the surface hydrophilizing apparatus 34 from the load lock chamber 31 by the transfer device 61. In the surface hydrophilizing apparatus 34, pure water is supplied onto the upper wafer W1 while rotating the upper wafer W1 held by the spin chuck. The supplied pure water is diffused on the bonding surface W1j of the upper wafer W1, and hydroxyl groups (silanol groups) adhere to the bonding surface W1j of the upper wafer W1 modified in the surface modifying apparatus 33, so that the bonding surface W1j is hydrophilized. Further, the bonding surface W1j of the upper wafer W1 is cleaned by the corresponding pure water (process S105).

Next, the hydrophilized upper wafer W1 is transferred into the position adjusting apparatus 51 by the transfer device 61. Then, the direction of the upper wafer W1 in the horizontal direction is adjusted by the position adjusting apparatus 51 (process S106).

Thereafter, the front/rear surfaces of the upper wafer W1 are inverted by the base inverting unit 51d of the position adjusting apparatus 51 and turned into a state in which the bonding surface W1j thereof faces downwards (process S107). Subsequently, the upper wafer W1 with the bonding surface W1j facing downwards is transferred into the substrate temperature adjusting apparatus 42 by the transfer device 61 and is attracted to and held by the first temperature adjusting plate 42a of the substrate temperature adjusting apparatus 42. As a result, the temperature of the upper wafer W1 is adjusted (process S108).

The processings from the processes S101 to S106 and the process S108 are performed on the lower wafer W2 as well. That is, the lower wafer W2 within the cassette C2 is withdrawn by the transfer device 22 and transferred onto the transition 54 of the processing station 3.

Afterwards, the lower wafer W2 is transferred into the load lock chamber 31 by the transfer device 61 (process S109). The load lock chamber 31 is then decompressed into a decompressed atmosphere (process S110).

Thereafter, the lower wafer W2 is transferred from the load lock chamber 31 into the surface modifying apparatus 33 by the modification transfer device 32a, and a bonding surface W2j thereof is modified (process S111). Then, the lower wafer W2 is transferred from the surface modifying apparatus 33 into the load lock chamber 31 by the modification transfer device 32a. The load lock chamber 31 is turned into the atmospheric atmosphere from the decompressed atmosphere, and the transfer of the lower wafer W2 is performed (process S112).

Then, the lower wafer W2 is transferred from the load lock chamber 31 into the surface hydrophilizing apparatus 34 by the transfer device 61, and the bonding surface W2j is hydrophilized and cleaned (process S113).

The hydrophilized lower wafer W2 is then transferred into the position adjusting apparatus 51 by the transfer device 61, and a direction of the lower wafer W2 in the horizontal direction is adjusted (process S114). At this time, the lower wafer W2 is held with the bonding surface W2j facing upwards.

Next, the lower wafer W2 with the bonding surface W2j facing upwards is transferred into the substrate temperature adjusting apparatus 42 and is attracted to and held by the second temperature adjusting plate 42b, so that the temperature thereof is adjusted (process S115). For example, in the substrate temperature adjusting apparatus 42, the lower wafer W2 is controlled to have a higher temperature than the upper wafer W1.

Furthermore, the transfer of the upper wafer W1 and the lower wafer W2 by the transfer device 61 in the processes S101 to S106 and S109 to S115 is performed by using the second holding unit 62b, and the transfer of the inverted upper wafer W1 with the bonding surface W1j facing downwards in the processes S107 and S108 is performed by using the first holding unit 62a, but not limited thereto.

Subsequently, in the bonding system 1, both the upper wafer W1 and the lower wafer W2 are transferred into the bonding apparatus 41 by the transfer device 61, and the upper wafer W1 is delivered to the upper chuck 230 and the lower wafer W2 is delivered to the lower chuck 231. Here, in order to deliver the upper wafer W1 and the lower wafer W2 at appropriate positions with respect to the upper chuck 230 and the lower chuck 231, respectively, the positions of the upper wafer W1 and the lower wafer W2 held by the transfer device are detected by using the position detectors 70a to 70d.

As stated above, however, the position detectors 70a to 70d are vertically arranged with respect to the surfaces of the upper wafer W1 and the lower wafer W2 which are held by the transfer device. Thus, if the two of the upper wafer W1 and the lower wafer W2 are held while being overlapped with each other, it is difficult to decide whether the detected position of the edge belongs to the upper wafer W1 or the lower wafer W2.

According to the exemplary embodiment, when the upper wafer W1 and the lower wafer W2 are transferred into the bonding apparatus 41 by the transfer device 61, the position detection is performed at a time when either one of the two wafers W1 and W2 is held. Accordingly, the control device 100 can accurately detect the positions of the edges of the upper wafer W1 and the lower wafer W2 held by the transfer device 61, so that it is possible to deliver the wafers at the appropriate positions with respect to the upper chuck 230 and the lower chuck 231.

To elaborate, the transfer device 61 receives the upper wafer W1 attracted to and held by the first temperature adjusting plate 42a with the first holding unit 62a thereof (process S116). At this time, since the transfer device 61 is holding a single sheet of the upper wafer W1, the position detectors 70a to 70d detect the position of the edge of the upper wafer W1. Thus, based on the detected position of the edge of the upper wafer W1, the control device 100 is capable of detecting the position of the upper wafer W1 held by the transfer device 61.

Subsequently, the transfer device 61 receives the lower wafer W2 attracted to and held by the second temperature adjusting plate 42b with the second holding unit 62b (process S117). Then, the transfer device 61 transfers both the upper wafer W1 and the lower wafer W2 into the bonding apparatus 41 (process S118).

Thereafter, based on the detected position of the upper wafer W1, the first holding unit 62a moves the upper wafer W1 to the appropriate position under the upper chuck 230, and the upper wafer W1 is attracted to and held by the upper chuck 230 (process S119). In the process S119, the upper wafer W1 is first attracted by the attracting/holding unit 300, and then, is attracted to and held by the upper chuck 230, as stated above.

Here, since the transfer device 61 is holding a single sheet of the lower wafer W2, the position detectors 70a to 70d detect the position of the edge of the lower wafer W2. Thus, based on the detected position of the edge of the lower wafer W2, the control device 100 is capable of detecting the position of the lower wafer W2 held by the transfer device 61.

Subsequently, based on the detected position of the lower wafer W2, the second holding unit 62b moves the lower wafer W2 to the appropriate position above the lower chuck 231, and the lower wafer W2 is attracted to and held by the lower chuck 231 (process S120).

As described above, in the present exemplary embodiment, the detection of the position of the edge is performed at a time when the transfer device 61 is holding either one of the upper wafer W1 and the lower wafer W2. Further, in the above description, though the positions of the upper wafer W1 and the lower wafer W2 are detected in the order of the upper wafer W1 and the lower wafer W2, the exemplary embodiment may not be limited thereto. By way of example, by switching the process S116 and the process S117 and switching the process S119 and the process S120, the positions of the upper wafer W1 and the lower wafer W2 may be detected in the order of the lower wafer W2 and the upper wafer W1.

Subsequently, in the bonding apparatus 41, positions of the upper wafer W1 held by the upper chuck 230 and the lower wafer W2 held by the lower chuck 231 are adjusted in the horizontal direction (process S121). Then, vertical positions of the upper wafer W1 held by the upper chuck 230 and the lower wafer W2 held by the lower chuck 231 are adjusted (process S122).

Thereafter, a central portion W1a of the upper wafer W1 and a central portion W2a of the lower wafer W2 are brought into contact with and pressed against each other by the push member 250 (process S123). Then, the upper wafer W1 and the lower wafer W2 are boned by an intermolecular force (process S124).

A combined wafer T composed of the upper wafer W1 and the lower wafer W2 bonded to each other is transferred to the transition 54 by the second holding unit 62b of the transfer device 61, for example (process S125). Afterwards, the combined wafer T is transferred into the cassette C3 on the preset placing plate 11 by the transfer device 22 of the carry-in/out station 2, and the series of processings are completed.

As discussed above, the bonding apparatus 41 according to the present exemplary embodiment includes the upper chuck 230, the lower chuck 231, the push pin 251 and the attracting/holding unit 300. The upper chuck 230 holds the upper wafer W1 from the top surface thereof which serves as the non-bonding surface W1n. The lower chuck 231 is provided under the upper chuck 230 and holds the lower wafer W2 from the bottom surface thereof while allowing the lower wafer W2 to face the upper wafer W1. The central portion W1a of the upper wafer W1 is pressed from above by the push pin 251 to be into contact with the lower wafer W2. The attracting/holding unit 300 is configured to be movable up and down with respect to the upper chuck 230, and holds the upper wafer W1 by attracting a part of the top surface of the upper wafer W1 before held by the upper chuck 230. Accordingly, the particle generation can be suppressed in the bonding apparatus 41.

Furthermore, in the above-described exemplary embodiments, only one load lock chamber 31 is provided. However, the exemplary embodiments are not limited thereto, and two or more load lock chambers may be provided. Further, the number of the transitions 31a1 and 31a2 within the load lock chamber 31 may be one or more than two.

In addition, in the above-described bonding system 1, the substrate temperature adjusting apparatus 42 is provided adjacent to the bonding apparatus 41. However, the exemplary embodiments may not be limited thereto, and the substrate temperature adjusting apparatus 42 may be provided at another place such as, by way of non-limiting example, the third processing block G3. Further, in the bonding system 1, the substrate temperature adjusting apparatus 42 may be omitted.

Moreover, in the above description, though the upper wafer W1 or the like is held by the vacuum attraction or by the placement, the exemplary embodiments are not limited thereto. By way of example, a mechanical chuck configured to hold a wafer mechanically or an electrostatic chuck configured to hold a wafer with an electrostatic attracting force may be appropriately used.

Furthermore, in the above description, though the push pin 251 is configured to push the upper wafer W1, the exemplary embodiments are not limited thereto. For example, the base member 310 of the attracting/holding unit 300 may be configured to push the upper wafer W1. With this configuration, the push pin 251 and the second linearly moving mechanism 501 may be removed, so that the configuration of the bonding apparatus 41 can be simplified.

Moreover, in the above-described exemplary embodiments, though the control device 100 controls the attracting/holding unit 300 of the bonding apparatus 41, the transfer device 61 and so forth, the bonding apparatus 41 itself may be equipped with a controller configured to control the attracting/holding unit 300 and the transfer device 61.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A bonding apparatus, comprising:
   an upper holding unit configured to hold a first substrate from a top surface thereof which is a non-bonding surface;
   a lower holding unit provided under the upper holding unit and configured to hold a second substrate from a bottom surface thereof while allowing the second substrate to face the first substrate;
   a pushing unit configured to press a central portion of the non-bonding surface the first substrate from above to bring a central portion of a bonding surface of the first substrate into contact with the second substrate;
an attracting/holding unit configured to be moved up and down with respect to the upper holding unit, hold a part of the non-bonding surface of the first substrate by attraction before the first substrate is held by the upper holding unit, and deliver the first substrate to the upper holding unit; and
a transfer unit configured to hold the first substrate by attracting at least a part of the non-bonding surface of the first substrate and transfer the first substrate to the attracting/holding unit,
wherein the upper holding unit holds the first substrate which is delivered from the attracting/holding unit.

2. The bonding apparatus of claim 1,
wherein the attracting/holding unit has an insertion through hole through which the pushing unit is inserted.

3. The bonding apparatus of claim 1,
wherein the attracting/holding unit comprises:
a base member configured to be moved up and down with respect to the upper holding unit;
an air suction path which is formed in the base member and through which suction air for attracting the first substrate is flown; and
an attracting member provided in the air suction path and configured to be brought into contact with and attracted to the first substrate before the first substrate is held by the upper holding unit,
wherein the attracting member is located such that the attracting member is protruded from an end surface of the base member at a side of the first substrate in a state before the attracting member comes into contact with the first substrate.

4. The bonding apparatus of claim 3,
wherein the attracting member comprises an elastic member.

5. The bonding apparatus of claim 1, further comprising:
a controller configured to control the attracting/holding unit,
wherein the controller controls the attracting/holding unit to hold the first substrate by the attraction and then raises the attracting/holding unit to deliver the first substrate held by the attracting/holding unit to the upper holding unit.

6. The bonding apparatus of claim 5,
wherein, after delivering the first substrate to the upper holding unit, the controller raises the attracting/holding unit until the attracting/holding unit is located above a holding surface of the upper holding unit.

7. The bonding apparatus of claim 1,
wherein the upper holding unit holds the first substrate by attraction, and
an attracting force of the attracting/holding unit is set to be equal to or smaller than an attracting force of the upper holding unit.

* * * * *